(12) United States Patent
Morita et al.

(10) Patent No.: US 11,637,035 B2
(45) Date of Patent: Apr. 25, 2023

(54) SUBSTRATE PROCESSING APPARATUS WITH MOVING DEVICE FOR CONNECTING AND DISCONNECTING HEATER ELECTRODES AND SUBSTRATE PROCESSING METHOD THEREOF

(71) Applicant: Tokyo Electron Limited, Tokyo (JP)

(72) Inventors: Satoshi Morita, Koshi (JP); Masami Akimoto, Koshi (JP); Katsuhiro Morikawa, Koshi (JP); Kouichi Mizunaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 856 days.

(21) Appl. No.: 16/583,590

(22) Filed: Sep. 26, 2019

(65) Prior Publication Data
US 2020/0105574 A1    Apr. 2, 2020

(30) Foreign Application Priority Data

Sep. 27, 2018 (JP) .............................. JP2018-182834
Mar. 28, 2019 (JP) .............................. JP2019-063375

(51) Int. Cl.
*H01L 21/687* (2006.01)
*H01L 21/67* (2006.01)
(Continued)

(52) U.S. Cl.
CPC .......... *H01L 21/68792* (2013.01); *B08B 3/04* (2013.01); *H01L 21/02041* (2013.01); *H01L 21/304* (2013.01); *H01L 21/6708* (2013.01); *H01L 21/67023* (2013.01); *H01L 21/67051* (2013.01); *H01L 21/67103* (2013.01)

(58) Field of Classification Search
CPC ......... H01L 21/68792; H01L 21/02041; H01L 21/304; H01L 21/67023; H01L 21/67051; H01L 21/6708; H01L 21/67103; H01L 21/67109; H01L 21/67248; H01L 21/6838; H01L 21/68721; H01L 21/68735; H01L 21/68742; H01L 21/68785; B08B 3/04
See application file for complete search history.

(56) References Cited

FOREIGN PATENT DOCUMENTS

JP    2002-219424 A      8/2002
JP    2015154063 A  *   8/2015

* cited by examiner

*Primary Examiner* — John P. Dulka
(74) *Attorney, Agent, or Firm* — Pearne & Gordon LLP

(57) ABSTRACT

A substrate processing apparatus includes a rotation driving device configured to rotate a rotary table holding a substrate; an electric heater provided at the rotary table and configured to heat the substrate; a power receiving electrode provided at the rotary table and electrically connected to the electric heater; a power feeding electrode configured to be contacted with the power receiving electrode to supply a power to the electric heater via the power receiving electrode; an electrode moving device configured to connect and disconnect the power feeding electrode and the power receiving electrode relatively; a power feeder configured to supply the power to the power feeding electrode; a processing cup disposed to surround the rotary table; at least one processing liquid nozzle configured to supply a processing liquid onto the substrate; a processing liquid supply device configured to supply the processing liquid to the processing liquid nozzle; and a controller.

19 Claims, 17 Drawing Sheets

(51) Int. Cl.
*H01L 21/304* (2006.01)
*B08B 3/04* (2006.01)
*H01L 21/02* (2006.01)

SUBSTRATE PROCESSING APPARATUS WITH MOVING DEVICE FOR CONNECTING AND DISCONNECTING HEATER ELECTRODES AND SUBSTRATE PROCESSING METHOD THEREOF

CROSS-REFERENCE TO RELATED APPLICATION

This application claims the benefit of Japanese Patent Application Nos. 2018-182834 and 2019-063375 filed on Sep. 27, 2018 and Mar. 28, 2019, respectively, the entire disclosures of which are incorporated herein by reference.

TECHNICAL FIELD

The various aspects and embodiments described herein pertain generally to a substrate processing apparatus and a substrate processing method.

BACKGROUND

In the manufacture of a semiconductor device, a wide variety of liquid processings such as a chemical liquid cleaning processing, a plating processing and a developing processing are performed on a substrate such as a semiconductor wafer. As an apparatus configured to perform such a liquid processing, there is known a single-wafer liquid processing apparatus, and an example of this single-wafer liquid processing apparatus is described in Patent Document 1.

The substrate processing apparatus of Patent Document 1 is equipped with a spin chuck capable of holding the substrate horizontally and rotating the substrate around a vertical axis. The substrate is held by a plurality of holding members provided at a peripheral portion of the spin chuck at a regular distance along a circumferential direction thereof. A circular plate-shaped top surface moving member and a circular plate-shaped bottom surface moving member each having a heater embedded therein are respectively disposed above and under the substrate held by the spin chuck. In the substrate processing apparatus of Patent Document 1, processings are performed in the following sequence.

First, the substrate is held by the spin chuck, and by raising the bottom surface moving member, a first gap is formed between a bottom surface (rear surface) of the substrate and a top surface of the bottom surface moving member. Then, a temperature-controlled chemical liquid is supplied into this first gap from a bottom surface supply passageway opened at a central portion of the top surface of the bottom surface moving member, so that the first gap is filled with the chemical liquid for surface processing. The chemical liquid is adjusted to have a preset temperature by the heater of the bottom surface moving member. In the meanwhile, a top surface supply nozzle is placed above a top surface (front surface) of the substrate to supply the chemical liquid for surface processing, so that a puddle of the chemical liquid is formed on the top surface of the substrate. Subsequently, the top surface supply nozzle is retreated from above the substrate, and the top surface moving member is lowered, so that a small second gap is formed between a bottom surface of the top surface moving member and a front surface (top surface) of the puddle of the chemical liquid. The puddle of the chemical liquid is adjusted to have a preset temperature by the heater embedded in the top surface moving member. In this state, a chemical liquid processing is performed on the front and rear surfaces of the substrate while rotating the substrate at a low speed or without rotating the substrate. During the chemical liquid processing, if necessary, the chemical liquid is replenished onto the top surface and the rear surface of the substrate from a chemical liquid supply passageway opened at a central portion of the top surface moving member and the aforementioned bottom surface supply passageway.

In the substrate processing apparatus of Patent Document 1, the substrate is heated by a fluid (a processing liquid and/or a gas) existing between the substrate and the heater.

Patent Document 1: Japanese Patent Laid-open Publication No. 2002-219424

SUMMARY

In one exemplary embodiment, a substrate processing apparatus includes a rotary table configured to hold a substrate horizontally; a rotation driving device configured to rotate the rotary table around a vertical axis; an electric heater provided at the rotary table to be rotated along with the rotary table and configured to heat the substrate placed on the rotary table; a power receiving electrode provided at the rotary table to be rotated along with the rotary table and electrically connected to the electric heater; a power feeding electrode configured to be contacted with the power receiving electrode to supply a power to the electric heater via the power receiving electrode; an electrode moving device configured to connect and disconnect the power feeding electrode and the power receiving electrode relatively; a power feeder configured to supply the power to the power feeding electrode; a processing cup disposed to surround the rotary table, and connected to an exhaust pipeline and a drain pipeline; at least one processing liquid nozzle configured to supply a processing liquid onto the substrate; a processing liquid supply device configured to supply the processing liquid to the at least one processing liquid nozzle; and a controller configured to control the electrode moving device, the power feeder, the rotation driving device and the processing liquid supply device.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
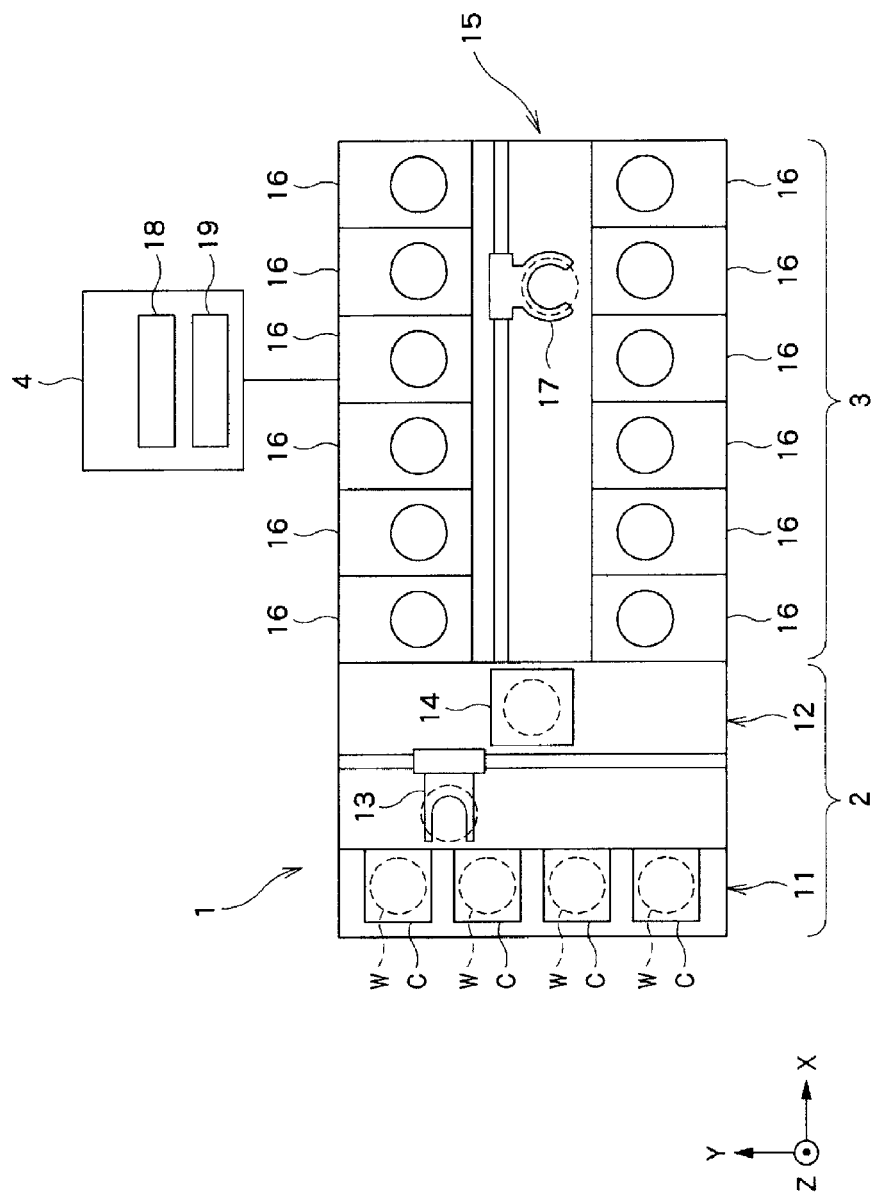
FIG. 1 is a schematic plan view illustrating an overall configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus (substrate processing system) according to an exemplary embodiment will be described with reference to the accompanying drawings.

FIG. 1 is a plan view illustrating an outline of the substrate processing system according to the exemplary embodiment. In the following, in order to clarify positional relationships, the X-axis, the Y-axis and the Z-axis which are orthogonal to each other will be defined. The positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, carriers C each accommodating semiconductor wafers W (hereinafter, referred to as "wafers W") horizontally are placed.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafer W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing unit 16 by using the wafer holding mechanism.

The processing units 16 perform a predetermined substrate processing on the wafer W transferred by the substrate transfer device 17.

Further, the substrate processing system 1 is equipped with a control device 4. The control device 4 is, for example, a computer, and includes a controller 18 and a storage 19. The storage 19 stores therein a program that controls various processings performed in the substrate processing system 1. The controller 18 controls the operation of the substrate processing system 1 by reading and executing the program stored in the storage 19.

Further, the program may be recorded in a computer-readable recording medium and may be installed to the storage 19 of the control device 4 from this recording medium. The computer-readable recording medium may be, by way of non-limiting example, a hard disk (HD), a flexible disk (FD), a compact disk (CD), a magnet optical disk (MO), a memory card, or the like.

In the substrate processing system 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, and then taken out from the processing unit 16 and placed on the delivery unit 14 by the substrate transfer device 17. After the processing of placing the wafer W on the delivery unit 14, the wafer W returns back into the carrier C of the carrier placing section 11 by the substrate transfer device 13.

Now, a configuration of the processing unit 16 according to the exemplary embodiment will be explained. The processing unit 16 is configured as a single-wafer dip liquid processing unit.

Figure 2:
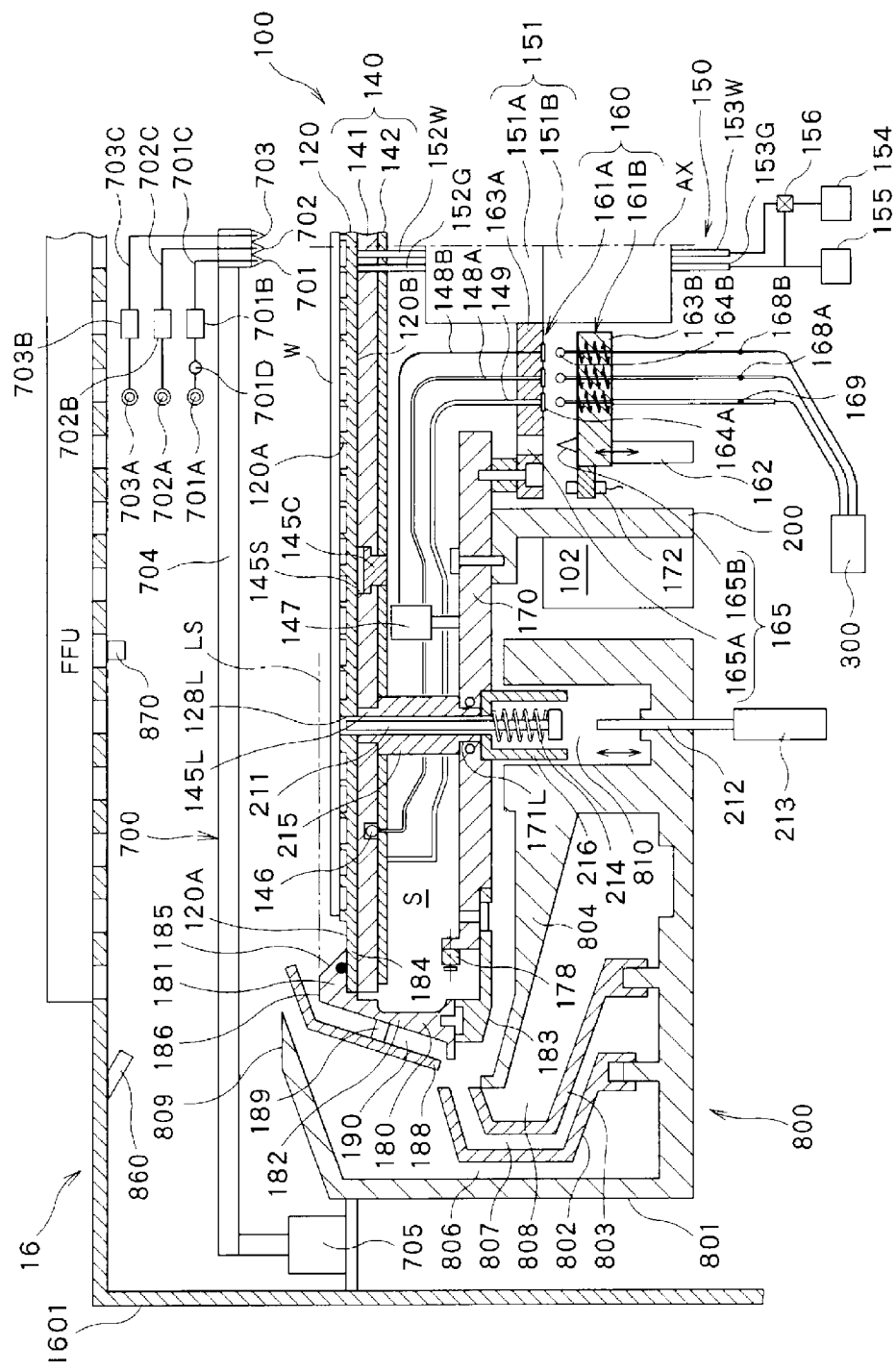
FIG. 2 is a schematic cross sectional view illustrating an example configuration of a processing unit provided in the substrate processing apparatus of FIG. 1.

As depicted in FIG. 2, the processing unit 16 is equipped with a rotary table 100, a processing liquid supply 700 configured to supply a processing liquid onto the wafer W, and a liquid recovery cup (processing cup) 800 configured to receive the processing liquid scattered from the substrate being rotated. The rotary table 100 is capable of holding and rotating a circular substrate such as the wafer W horizontally. The constituent components of the processing unit 16 such as the rotary table 100, the processing liquid supply 700 and the liquid recovery cup 800 are accommodated in a housing 1601 (also referred to as a "processing chamber"). FIG. 2 illustrates only a left half of the processing unit 16.

The rotary table 100 includes an attraction plate 120, a hot plate 140, a support plate 170, a periphery cover body 180 and a hollow rotation shaft 200. The attraction plate 120 is configured to attract the wafer W placed thereon horizontally. The hot plate 140 serves as a base plate of the attraction plate 120, and is configured to support and heat the attraction plate 120. The support plate 170 is configured to support the attraction plate 120 and the hot plate 140. The rotation shaft 200 extends downwards from the support plate 170. The rotary table 100 is rotated around a vertically extending rotation axis Ax by an electric driving unit (rotation driving device) 102 disposed around the rotation shaft 200, so that the wafer W held by the rotary table 100 can be rotated around the rotation axis Ax. The electric driving unit 102 (details of which are not illustrated) is configured to transfer a motive power generated by an electric motor to the rotation shaft 200 via a power transmission mechanism (for example, a belt and a pulley) to rotate the rotation shaft 200. Alternatively, the electric driving unit 102 may be configured to rotate the rotation shaft 200 directly by the electric motor.

The attraction plate 120 is a circular plate-shaped member having a diameter slightly larger than a diameter of the wafer W (or equal to the diameter of the wafer W depending on the configuration), that is, having an area larger than or equal to an area of the wafer W. The attraction plate 120 has a top surface (front surface) 120A configured to attract a bottom surface (a surface which is not a processing target) of the wafer W; and a bottom surface (rear surface) 120B which is in contact with a top surface of the hot plate 140. The attraction plate 120 may be made of a material having high thermal conductivity such as thermal conductive ceramics, for example, SiC. Desirably, the thermal conductivity of the material forming the attraction plate 120 is equal to or higher than 150 W/m·k.

The hot plate 140 is a circular plate-shaped member having a diameter substantially equal to the diameter of the attraction plate 120. The hot plate 140 has a plate main body 141 and an electric heater 142 provided in the plate main body 141. The plate main body 141 is made of a material having high thermal conductivity such as thermal conductive ceramics, for example, SiC. Desirably, the thermal conductivity of the material forming the plate main body 141 is equal to or higher than 150 W/m·k.

Figure 3:
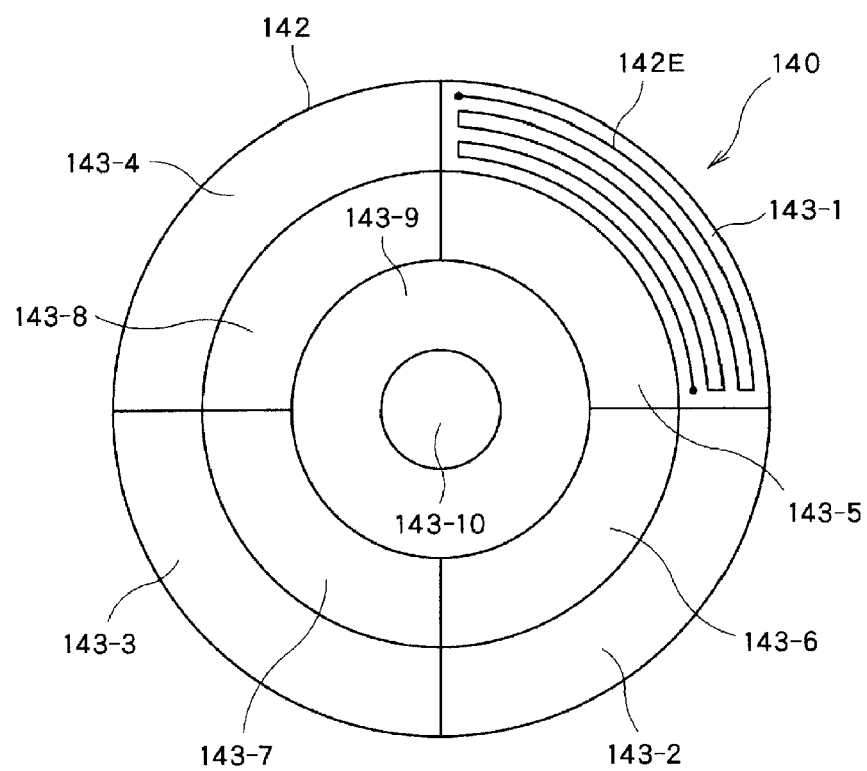
FIG. 3 is a schematic plan view illustrating an example layout of a heater of a hot plate provided in the processing unit.

The heater 142 may be a surface-shaped heater such as a polyimide heater provided on a bottom surface (rear surface) of the plate main body 141. Desirably, a multiple number of (for example, ten) heating zones 143-1 to 143-10 are set in the hot plate 140, as illustrated in FIG. 3. The heater 142 are composed of a multiple number of heater elements 142E respectively provided in the heating zones 143-1 to 143-10. Each heater element 142E is formed of a conductor extending in a zigzag shape within the corresponding one of the heating zones 143-1 to 143-10. FIG. 3 illustrates only the heater element 142E within the heating zone 143-1.

Power can be fed to these heater elements 142E independently by a power feeder 300 to be described later. Accordingly, different heating zones of the wafer W can be heated under different conditions, so that a temperature distribution of the wafer W can be controlled.

Figure 4:
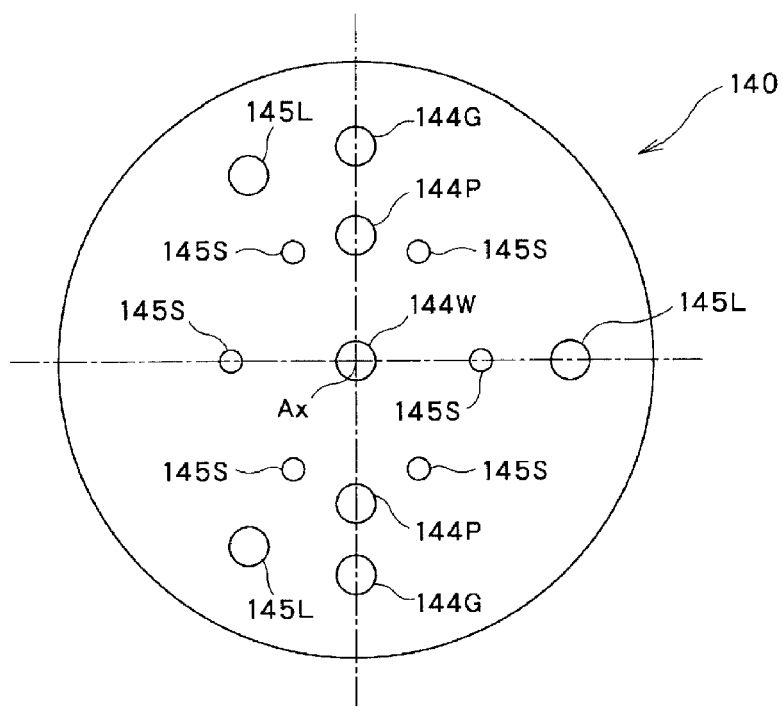
FIG. 4 is a schematic plan view illustrating a top surface of the hot plate.

As shown in FIG. 4, one or more (two in the shown example) plate suction holes 144P, one or more (one at a central portion in the shown example) substrate suction hole 144W, one or more (two at an outer side in the shown example) purge gas supply holes 144G are formed at the top surface (front surface) of the plate main body 141. The plate suction holes 144P are used to transfer a suction force for attracting the attraction plate 120 to the hot plate 140. The substrate suction hole 144W is used to transfer a suction force for attracting the wafer W to the attraction plate 120.

Further, the plate main body 141 is provided with a plurality of (three in the shown example) lift pin holes 145L through which lift pins 211 to be described later pass; and a multiplicity of (six in the shown example) service holes 145S for accessing assembly screws of the rotary table 100. In a typical operation mode, the service holes 145S are closed with caps 145C.

The aforementioned heater elements 142E are arranged, avoiding the plate suction holes 144P, the substrate suction hole 144W, the purge gas supply holes 144G, the lift pin holes 145L and the service holes 145S. Further, by achieving the connection to the rotation shaft 200 through an electromagnet, the service holes may be omitted.

Figure 5:
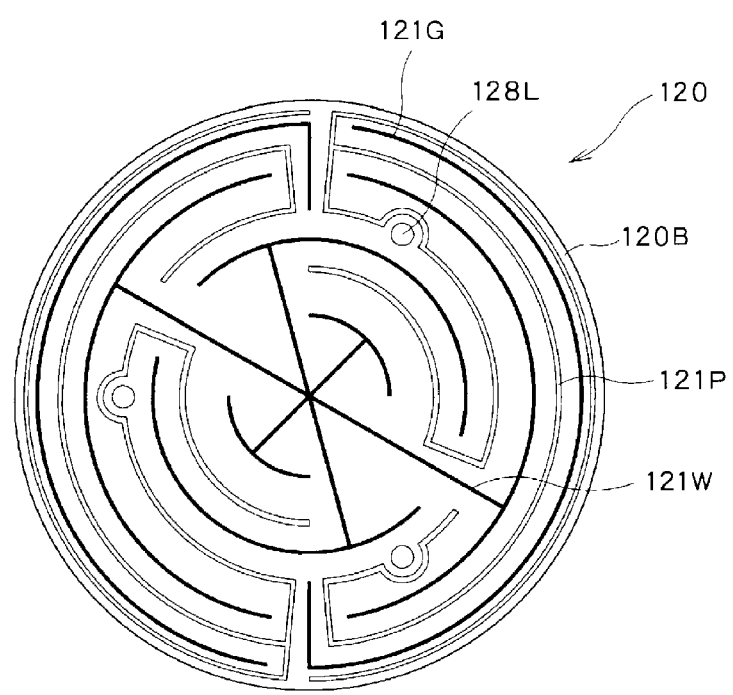
FIG. 5 is a schematic plan view illustrating an example structure of a bottom surface of an attraction plate provided in the processing unit.

As shown in FIG. 5, a plate bottom surface suction path groove 121P, a substrate bottom surface suction path groove 121W, a bottom surface purge path groove 121G are formed at the bottom surface 120B of the attraction plate 120. When the attraction plate 120 is placed on the hot plate 140 with an appropriate positional relationship, at least a part of the plate bottom surface suction path groove 121P communicates with the plate suction hole 144P. Likewise, at least a part of the substrate bottom surface suction path groove 121W communicates with the substrate suction hole 144W, and at least a part of the bottom surface purge path groove 121G communicates with the purge gas supply hole 144G. The plate bottom surface suction path groove 121P, the substrate bottom surface suction path groove 121W and the bottom surface purge path groove 121G are disconnected from each other (do not communicate with each other).

Figure 10:
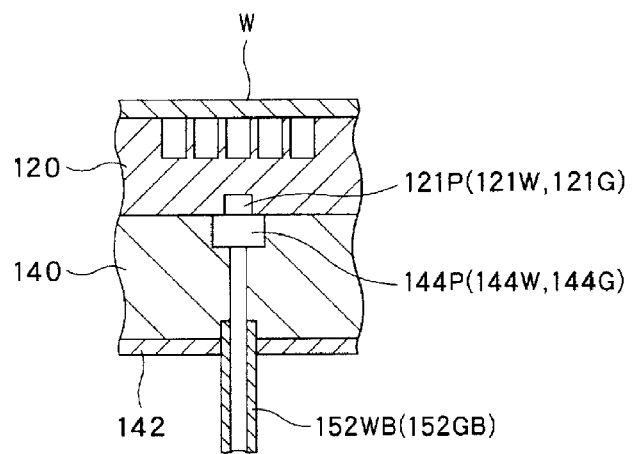
FIG. 10 is a schematic cross sectional view of the attraction plate taken along a plane different from that of FIG. 9.

FIG. 10 schematically illustrates a state in which the suction hole 144P (or 144W, or 144G) of the hot plate 140 are overlapped with and communicate with the path groove 121P (or 121W, or 121G) of the attraction plate 120.

Figure 6:
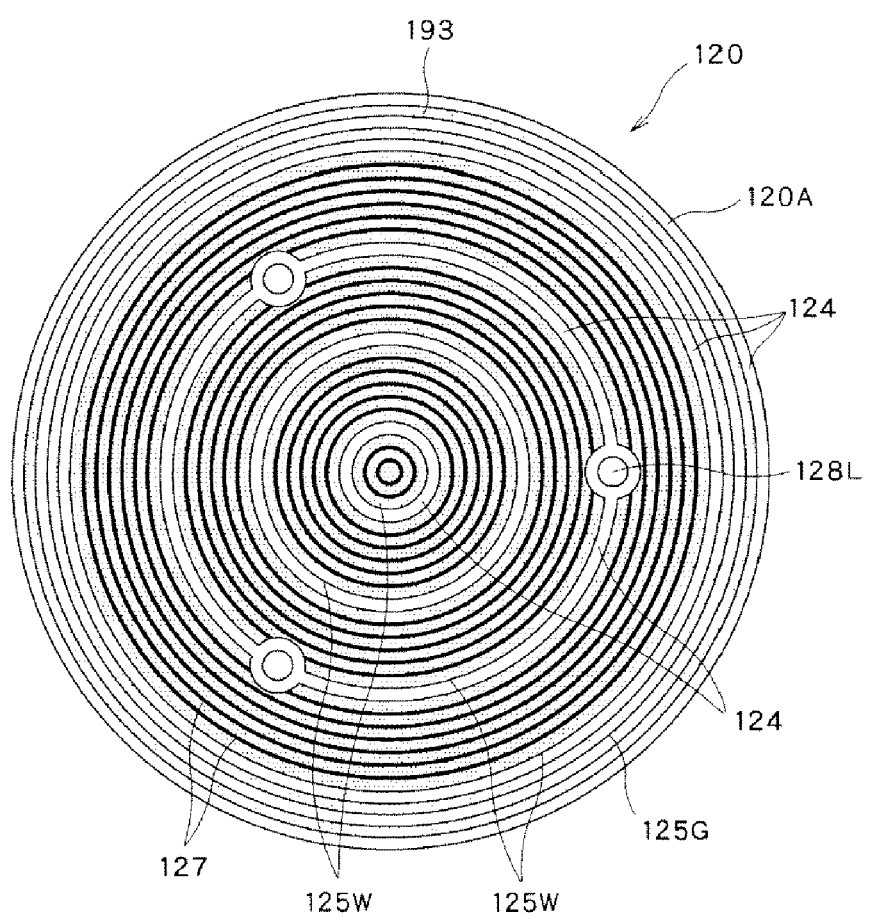
FIG. 6 is a schematic plan view illustrating an example structure of a top surface of the attraction plate.
Figure 9:
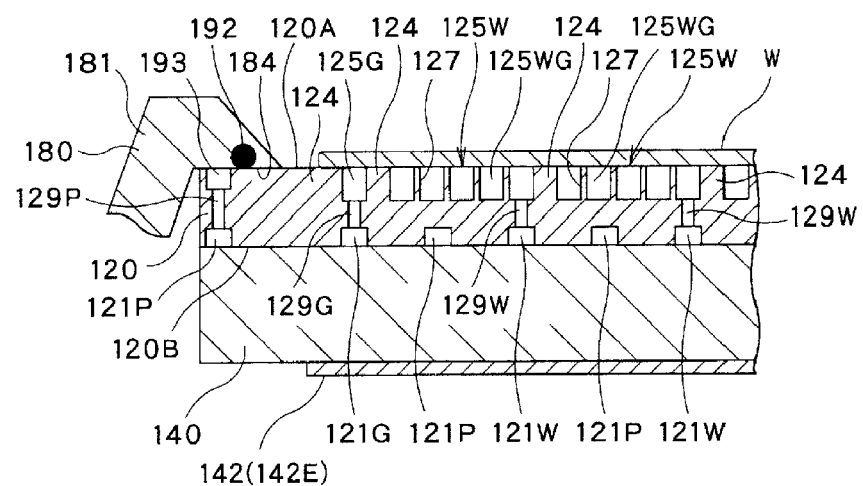
FIG. 9 is a schematic cross sectional view of the attraction plate shown in FIG. 5 and FIG. 6.

As illustrated in FIG. 6 and FIG. 9, a plurality of (five in the shown example) thick ring-shaped partition walls 124 is formed on the top surface 120A of the attraction plate 120. The thick partition walls 124 form, at the top surface 120A, a plurality of recess regions 125W and 125G (four annular regions at outer sides and one circular region at the innermost side) which are disconnected from each other.

Through holes 129W, which are formed through the attraction plate 120 in a thickness direction thereof, are formed at the substrate bottom surface suction path groove 121W, and each through hole allows the substrate bottom surface suction path groove 121W to communicate with the corresponding one of the plurality of (four in the shown example) recess regions 125W.

Further, through holes 129G, which are formed through the attraction plate 120 in the thickness direction thereof, are formed at the bottom surface purge path groove 121G, and each through hole allows the bottom surface purge path groove 121G to communicate with the outermost recess region 125G. The outermost recess region 125G serves as a top surface purge path groove having a single circular ring shape.

Substantially ring-shaped narrow separation walls 127 are concentrically provided within each of the four recess regions 125W located at the inner side. The narrow separation wall 127 forms at least one top surface suction path groove 125W which extends in a zigzag shape within each recess region 125W. That is, the narrow separation wall 127 serves to distribute the suction force in a uniform manner within each recess region 125W.

Figure 11:
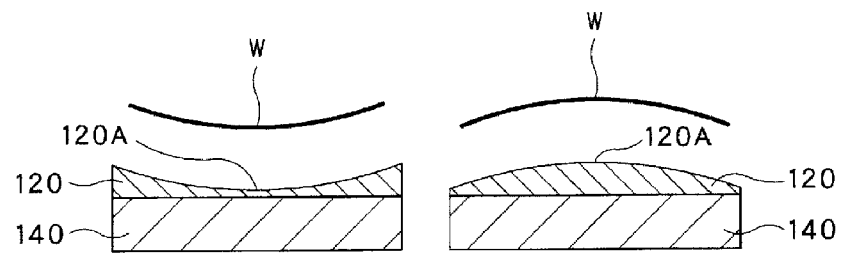
FIG. 11 is a schematic diagram illustrating curved attraction plates.

The top surface 120A of the attraction plate 120 may be flat in overall. The top surface 120A of the attraction plate 120 may be gently curved, as schematically illustrated in FIG. 11. It is known that the wafer W is curved in a certain direction depending on a structure and an array of devices formed on the surface of the wafer W. By using the attraction plate 120 whose top surface 120A is curved to conform to the curve of the wafer W, the attraction of the wafer W can be securely carried out.

Figure 12:
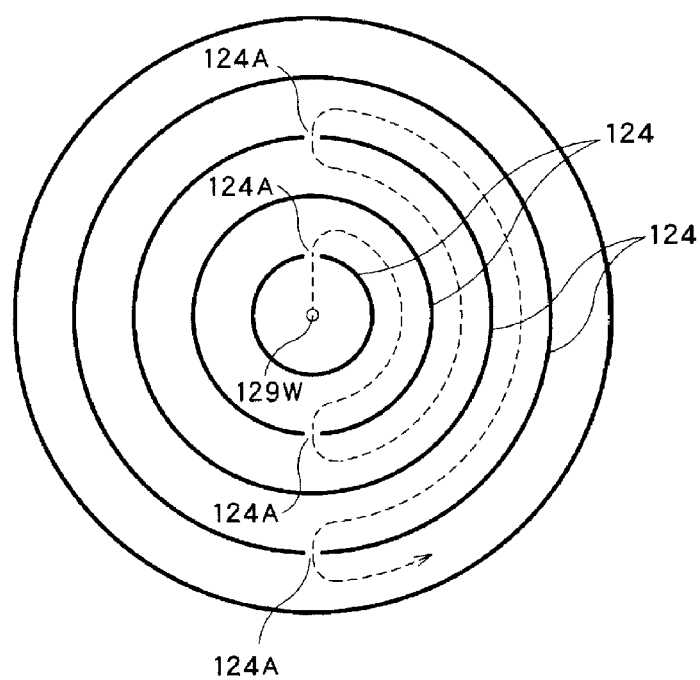
FIG. 12 is a schematic plan view illustrating a modification example of the attraction plate.

In the exemplary embodiment shown in FIG. 6, the recess regions 125W isolated from each other by the partition walls 124 are provided. However, the exemplary embodiment is not limited thereto. By way of example, as schematically illustrated in FIG. 12, the partition walls 124 may be provided with communication paths 124A through which the recess regions 125W are allowed to communicate with each other. In this configuration, only one through hole 129W may be provided at, for example, the central portion of the attraction plate 120. Further, without using the thick partition walls 124, the narrow separation walls 127 may be formed to have the same structure as that of the partition walls 124 in FIG. 12.

As depicted in FIG. 2, a suction/purge unit 150 is provided in the vicinity of the rotation axis Ax. The suction/purge unit 150 is equipped with a rotary joint 151 provided within the hollow rotation shaft 200. An upper piece 151A of the rotary joint 151 is connected with a suction line 152W communicating with the plate suction hole 144P and the substrate suction hole 144W of the hot plate 140; and a purge gas supply line 152G communicating with the purge gas supply hole 144G.

Though not shown, the suction line 152W may be branched into a branch suction line, and this branch suction line may be connected to the plate main body 141 of the hot plate 140 directly under the plate suction hole 144P and the substrate suction hole 144W. In this case, vertically extending through holes may be formed through the plate main body 141, and the branch suction line may be connected to each through hole. Likewise, the purge gas supply line 152G may be branched, and this branch purge gas supply line may be connected to the plate main body 141 of the hot plate 140 directly under the purge gas supply hole 144G. In this configuration, vertically extending through holes may be formed through the plate main body 141, and the branch purge gas supply line may be connected to each through hole. The aforementioned branch suction line and the branch purge gas supply line are schematically illustrated in FIG. 10 (see reference numerals 152WB and 152GB, respectively).

Alternatively, the suction line 152W and the purge gas supply line 152G may be connected to a central portion of the plate main body 141 of the hot plate 140. In this case, a path through which the suction line 152W is allowed to communicate with the plate suction hole 144P and the substrate suction hole 144W and a path through which the purge gas supply line 152G is allowed to communicate with the purge gas supply hole 144G are provided within the plate main body 141.

The lower piece 151B of the rotary joint 151 is connected with a suction line 153W communicating with the suction line 152W; and a purge gas supply line 153G communicating with the purge gas supply line 151G. The rotary joint 151 is configured such that the upper piece 151A and the lower piece 151B can be rotated relative to each other while the communication between the suction lines 152W and 153W and the communication between the purge gas supply lines 152G and 153G are maintained. The rotary joint 151 itself having this function is one commonly known.

The suction line 153W is connected to a suction device 154 such as a vacuum pump. The purge gas supply line 153G is connected to a purge gas supply device 155. The suction line 153W is also connected to the purge gas supply device 155. Further, there is also provided a switching device 156 (for example, a three-way valve) configured to switch the connection destination of the suction line 153W between the suction device 154 and the purge gas supply device 155.

The hot plate 140 has therein temperature sensors 146 configured to detect a temperature of the plate main body 141 of the hot plate 140. For example, the temperature sensors 146 may be provided for the ten heating zones 143-1 to 143-10 in one-to-one correspondence. Further, at least one thermo switch 147 is provided near the heater 142 of the hot plate 140 to detect overheating of the heater 142.

Besides the temperature sensors 146 and the thermo switch 147, control signal lines 148A and 148B for transmitting detection signals of the temperature sensors 146 and the thermo switch 147 and a power feed line 149 for supplying power to each heater element 142E of the heater 142 are provided within a space S between the hot plate 140 and the support plate 170.

As depicted in FIG. 2, a switch device 160 is provided in the vicinity of the rotary joint 151. The switch device 160 includes a first electrode unit 161A fixed with respect to the direction of the rotation axis Ax; a second electrode unit 161B configured to be movable in the direction of the rotation axis Ax; and an electrode moving device 162 (elevating device) configured to move the second electrode unit 161B up and down in the direction of the rotation axis Ax.

Figure 7:
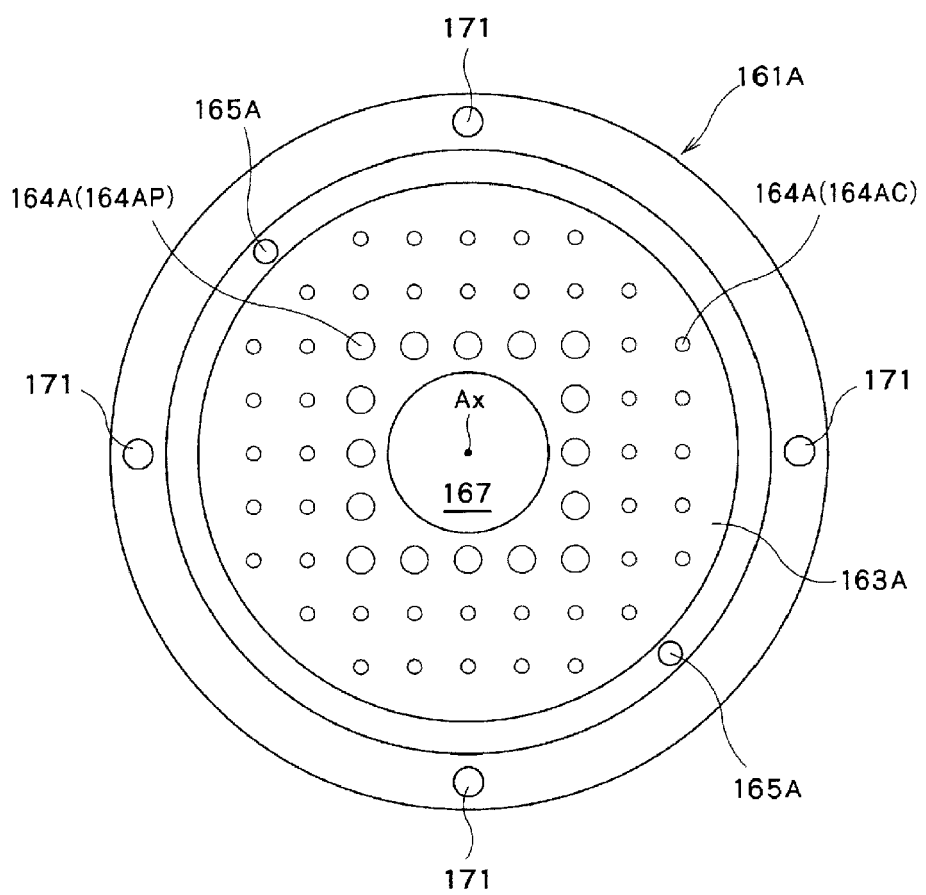
FIG. 7 is a schematic plan view illustrating an example structure of a first electrode unit provided in the processing unit.

As illustrated in FIG. 7, the first electrode unit 161A is equipped with a first electrode supporting body 163A and a plurality of first electrodes 164A supported by the first electrode supporting body 163A. The first electrodes 164A include first electrodes 164AC (indicated by small 'O' in FIG. 7) for control signal communication connected to the control signal lines 148A and 148B; and first electrodes 164AP (indicated by large "O" in FIG. 7) for heater power feed connected to the power feed line 149. It is desirable that the first electrode 164AP in which a large current (heater current) flows is set to have an area larger than an area of the first electrode 164AC in which a small current (control signal current) flows.

The first electrode supporting body 163A is a circular plate-shaped member in overall. Formed at a central portion of the first electrode supporting body 163A is a circular hole 167 into which the upper piece 151A of the rotary joint 151 is inserted. The upper piece 151A of the rotary joint 151 may be fixed to the first electrode supporting body 163A. A peripheral portion of the first electrode supporting body 163A may be screw-coupled to the support plate 170 by using screw holes 171.

As schematically illustrated in FIG. 2, the second electrode unit 161B is equipped with a second electrode supporting body 163B and a plurality of second electrodes 164B supported by the second electrode supporting body 163B. In overall, the second electrode supporting body 163B is a circular plate-shaped member having the same diameter as that of the first electrode supporting body 163A shown in FIG. 7. Formed at a central portion of the second electrode supporting body 163B is a circular hole through which the lower piece 151B of the rotary joint 151 can pass.

The second electrodes 164B configured to be connected to/disconnected from the first electrodes 164A by being moved up and down with respect to the first electrodes 164A have the same layout as that of the first electrodes 164A. Hereinafter, the second electrodes 164B (power feeding electrode) configured to come into contact with the first electrodes 164AP (power receiving electrode) for heater power feed will also be referred to as "second electrodes 164BP". Further, the second electrodes 164B configured to be brought into contact with the first electrodes 164AC for control signal communication will also be referred to as "second electrodes 164BC". The second electrodes 164BP are connected to a power output terminal of a power feed device (power feeder) 300. The second electrodes 164BC are connected to a control input/output terminal of the power feeder 300.

At least a part of conductive paths (conductive lines) 168A, 168B and 169 (see FIG. 2) connecting the second electrodes 164B and the power output terminal and the control input/output terminal of the power feeder 300 is made of a flexible wire. Due to the flexible wire, the entire second electrode unit 161B can be rotated around the rotation axis Ax in a forward rotation direction and in a backward rotation direction from a neutral position at a preset angle while maintaining the electric conduction between the second electrodes 164B and the power feeder 300. The preset angle may be, by way of example, 180 degrees, but not limited thereto. This means that the rotary table 100 can be rotated about ±180 degrees while maintaining the connection between the first electrodes 164A and the second electrodes 164B.

One of the first electrode 164A and the second electrode 164B in each pair may be configured as a pogo pin. In FIG. 2, all the second electrodes 164B are configured as the pogo pins. Here, the term "pogo pin" is widely used to imply an extensible/contractible rod-shaped electrode having a spring embedded therein. Instead of the pogo pin, a socket, a magnet electrode, an induction electrode, or the like may be used as the electrode.

Desirably, there may be provided a lock device 165 configured to lock the first electrode supporting body 163A and the second electrode supporting body 163B not to be rotated relative to each other when the first electrode 164A and the second electrode 164B in each pair are in appropriate contact with each other. By way of example, as shown in FIG. 2, the lock device 165 may be composed of a hole 165A provided at the first electrode supporting body 163A; and a pin 165B provided at the second electrode supporting body 163B and configured to be fitted into the hole 165A.

It may be desirable to provide a device 172 (schematically illustrated in FIG. 2) configured to detect an appropriate contact between the first electrode 164A and the second electrode 164B in each pair. This device 172 may be an angular position sensor (not shown) configured to detect a state in which an angular positional relationship between the first electrode supporting body 163A and the second electrode supporting body 163B is appropriate. Alternatively, this device 172 may be a distance sensor (not shown) configured to detect a state in which a distance between the first electrode supporting body 163A and the second electrode supporting body 163B in the direction of the rotation axis Ax is appropriate. Still alternatively, a contact type sensor (not shown) configured to detect an appropriate engagement of the pin 165B into the hole 165A of the lock device 165 may be provided.

The electrode moving device 162 schematically illustrated in FIG. 2 may be equipped with, though not shown, a push rod configured to push the second electrode supporting body 163B upwards; and an elevating device (an air cylinder, a ball screw, or the like) configured to move the push rod up and down (first configuration example). For example, when using this configuration, a permanent magnet may be provided at the first electrode supporting body 163A, and an electromagnet may be provided at the second electrode supporting body 163B. With this configuration, when necessary, the first electrode unit 161A and the second electrode unit 161B can be coupled not to be moved relative to each other in the vertical direction, and the first electrode unit 161A and the second electrode unit 161B can be disconnected from each other.

When adopting the first configuration example, if the connection/disconnection between the first electrode unit 161A and the second electrode unit 161B are performed at the same angular position on the rotary table 100, the second electrode unit 161B need not be supported to be rotatable around the rotation axis Ax. That is, only a member (for example, the aforementioned push rod, or another support table) configured to support the second electrode unit 161B when the first electrode unit 161A and the second electrode unit 161B are disconnected from each other needs to be provided.

Instead of the aforementioned first configuration example, a second configuration example may be adopted. Though not illustrated in detail, the second configuration example of the electrode moving device 162 includes a first ring-shaped member having a circular ring shape centered on the rotation axis Ax; a second ring-shaped member configured to support the first ring-shaped member; a bearing provided between the first and second ring-shaped members and configured to allow the first and second ring-shaped members to be rotated relative to each other; and an elevating device (such as an air cylinder, a ball screw, or the like) configured to move the second ring-shaped member up and down.

In the first configuration example and the second configuration example, it is possible to rotate the first electrode unit 161A and the second electrode unit 161B together within a limited range while keeping the first electrode 164A and the second electrode 164B of each pair in an appropriate contact with each other.

The electric driving unit 102 of the rotary table 100 has a positioning function of stopping the rotary table 100 at a certain rotational angular position. This positioning function can be implemented by rotating a motor of the electric driving unit 102 based on a detection value of a rotary encoder embedded in the rotary table 100 (or a member rotated by the rotary table 100). By raising the second electrode unit 161B with the electrode moving device 162 while keeping the rotary table 100 stopped at the preset rotational angular position, corresponding electrodes of the first electrode unit 161A and the second electrode unit 161B can be brought into contact with each other appropriately. When disconnecting the second electrode unit 161B from the first electrode unit 161A, it is desirable to perform this disconnection in the state that the rotary table 100 is stopped at the preset rotational angular position.

As stated above, the various electronic components (heater, wiring, sensors) are disposed within the space S between the attraction plate 120 and the support plate 170 and at the positions facing the space S. The periphery cover body 180 suppresses a processing liquid supplied to the wafer W, particularly, a corrosive chemical liquid from entering the space S, thus protecting the electronic components. A purge gas ($N_2$ gas) may be supplied into the space S through a pipeline (not shown) branched from the purge gas supply line 152G. By supplying the purge gas into the space S in this way, a corrosive gas originated from the chemical liquid can be suppressed from reaching the inside of the space S from the outside thereof, so that the space S can be maintained in a non-corrosive atmosphere.

As shown in FIG. 2, the periphery cover body 180 has an upper portion 181, a side peripheral portion 182 and a lower portion 183. The upper portion 181 is protruded above the attraction plate 120 and connected to the attraction plate 120. The lower portion 183 of the periphery cover body 180 is coupled to the support plate 170.

An inner edge of the upper portion 181 of the periphery cover body 180 is located at an inner side than an outer edge of the attraction plate 120 in a radial direction thereof. The upper portion 181 has a circular ring-shaped bottom surface 184 in contact with the top surface of the attraction plate 120; an inclined circular ring-shaped inner peripheral surface 185 starting from an inner edge of the bottom surface 184; and a circular ring-shaped outer peripheral surface 186 extending substantially horizontally outwards in the radial direction from an outer edge of the inner peripheral surface 185. The inner peripheral surface 185 is inclined to be lowered as it approaches the central portion of the attraction plate 120.

It is desirable to provide a seal between the top surface 120A of the attraction plate 120 and the bottom surface 184 of the upper portion 181 of the periphery cover body 180 to suppress the liquid from being introduced. The seal may be an O-ring 192 disposed between the top surface 120A and the bottom surface 184.

As depicted in FIG. 5, a part of the plate bottom surface suction path groove 121P extends in the circumferential direction at the outermost portion of the attraction plate 120. Further, as shown in FIG. 6, a groove 193 extends continuously in the circumferential direction at the outermost portion of the top surface 120A of the attraction plate 120. As illustrated in FIG. 9, the plate bottom surface suction path groove 121P at the outermost portions and the groove 193 communicate with each other via multiple through holes 129P which are formed through the attraction plate 120 in a thickness direction and arranged at a regular distance therebetween in the circumferential direction. The bottom surface 184 of the upper portion 181 of the periphery cover body 180 is placed on the groove 193. Accordingly, the bottom surface 184 of the upper portion 181 of the periphery cover body 180 is attracted to the top surface 120A of the attraction plate 120 by a negative pressure acting on the plate bottom surface suction path groove 121P. Since the O-ring 192 is squashed through this attraction, secure sealing is achieved.

A height of the outer peripheral surface 186, that is, a top portion of the periphery cover body 180 is higher than a height of the wafer W held by the attraction plate 120. Accordingly, if the processing liquid is supplied onto the top surface of the wafer W in the state that the wafer W is held by the attraction plate 120, a liquid accumulation (puddle), in which the wafer W can be immersed so that the top surface of the wafer W is located under a liquid surface LS, can be formed. That is, the upper portion 181 of the periphery cover body 180 forms an embankment surrounding the wafer W held by the attraction plate 120. A recess portion in which the processing liquid can be stored is formed and confined by this embankment and the attraction plate 120.

An inclination of the inner peripheral surface 185 of the upper portion 181 of the periphery cover body 180 facilitates outward scattering of the processing liquid within the aforementioned recess portion when the rotary table 100 is rotated at a high speed. That is, this inclination suppresses the liquid from staying on the inner peripheral surface of the upper portion 181 of the periphery cover body 180 when the rotary table 100 is rotated at the high speed.

A rotary cup 188 (rotary liquid-receiving member) configured to be rotated along with the periphery cover body 180 is provided at an outside of the periphery cover body 180 in the radial direction. The rotary cup 188 is connected to a constituent component of the rotary table 100, that is, the periphery cover body 180 in the shown example, via a plurality of connecting members 189 arranged at a regular distance therebetween in the circumferential direction. An upper end of the rotary cup 188 is located at a height where the processing liquid scattered from the wafer W can be received. A passageway 190 through which the processing liquid scattered from the wafer W flows down is formed between an outer surface of the side peripheral portion 182 of the periphery cover body 180 and an inner surface of the rotary cup 188.

A liquid recovery cup 800 surrounds the rotary table 100 and collects the processing liquid scattered from the wafer W. In the shown exemplary embodiment, the liquid recovery cup 800 includes a stationary outer cup component 801, a first movable cup component 802 and a second movable cup component 803 configured to be movable up and down, and a stationary inner cup component 804. A first drain passageway 806, a second drain passageway 807 and a third drain passageway 808 are formed between the neighboring cup components (that is, between 801 and 802, between 802 and 803, and between 803 and 804). By varying the positions of the first and second movable cup components 802 and 803, the processing liquid flown out from the passageway 190 between the periphery cover body 180 and the rotary cup 188 can be guided into a selected one of the three drain passageways 806 to 808. Each of the first drain passageway 806, the second drain passageway 807 and the third drain passageway 808 is connected to any one of an acidic liquid drain passageway, an alkaline liquid drain passageway and an organic liquid drain passageway (all of which are not illustrated) which are provided in a semiconductor manufacturing factory. A non-illustrated gas-liquid separating structure is provided within each of the first drain passageway 806, the second drain passageway 807 and the third drain passageway 808. The first drain passageway 806, the second drain passageway 807 and the third drain passageway 808 are connected to and suctioned by a factory exhaust system via an exhaust device (not shown) such as an ejector. This liquid recovery cup 800 is well-known by Japanese Patent Laid-open Publication No. 2012-129462, Japanese Patent Laid-open Publication No. 2014-123713, Japanese laid-open publication pertinent to the present application by the present applicant, and so forth. For details of this liquid recovery cup, these documents may be referred to.

Three lift pin holes 128L and three lift pin hoes 171L are formed at the attraction plate 120 and the support plate 170, respectively, to be aligned with the three lift pin holes 145L of the hot plate 140 in the direction of the rotation axis Ax.

The rotary table 100 is equipped with a plurality of (three in the shown example) lift pins 211 inserted through the lift pin holes 145L, 128L and 171L. The lift pins 211 can be moved between a transfer position (raised position) where an upper end of the lift pin 211 protrudes above the top surface 120A of the attraction plate 120 and a processing position (lowered position) where the upper end of the lift pin 211 is located under the top surface 120A of the attraction plate 120.

A push rod 212 is provided under each lift pin 211. The push rod 212 can be moved up and down by an elevating device 213, for example, an air cylinder. By pushing lower ends of the lift pins 211 upwards with the push rods 212, the lift pins 211 can be raised to the transfer position. Alternatively, the push rods 212 may be provided at a ring-shaped support body (not shown) centered on the rotation axis Ax and moved up and down by moving the ring-shaped support body up and down by a common elevating device.

The wafer W placed on the lift pins 211 at the transfer position is located at a height position higher than an upper end 809 of the stationary outer cup component 801, and this wafer W can be transferred to/from an arm (see FIG. 1) of the substrate transfer device 17 advanced into the processing unit 16.

If the push rod 212 is distanced away from the lift pin 211, the lift pin 211 is lowered down to the processing position by an elastic force of a return spring 214 and held at this processing position. In FIG. 2, a reference numeral 215 denotes a guide member configured to guide the vertical movement of the lift pin 211, and a reference numeral 216 indicates a spring seat configured to receive the return spring 214. Further, a circular ring-shaped recess 810 is formed at the stationary inner cup component 804 to allow rotation of the spring seat 216 around the rotation axis Ax.

The processing liquid supply 700 is equipped with a multiple number of nozzles. These nozzles include a chemical liquid nozzle 701, a rinse nozzle 702, and a drying accelerator liquid nozzle 703. A chemical liquid is supplied into the chemical liquid nozzle 701 from a chemical liquid source 701A via a chemical liquid supply mechanism 701B including a flow control device (not shown) such as a flow rate control valve and an opening/closing valve which are provided at a chemical liquid supply line (pipeline) 701C. A rinse liquid is supplied into the rinse nozzle 702 from a rinse liquid source 702A via a rinse liquid supply mechanism 702B including a flow control device (not shown) such as a flow rate control valve and an opening/closing valve which are provided at a rinse liquid supply line (pipeline) 702C. A drying accelerator liquid, for example, IPA (Isopropyl Alcohol) is supplied into the drying accelerator liquid nozzle 703 from a drying accelerator liquid source 703A via a drying accelerator liquid supply mechanism 703B including a flow control device (not shown) such as a flow rate control valve and an opening/closing valve which are provided at a drying accelerator supply line (pipeline) 703C.

The chemical liquid supply line 701C may be equipped with a heater 701D as a temperature control device for controlling a temperature of the chemical liquid. Further, a tape heater (not shown) for controlling the temperature of the chemical liquid may be provided at a pipeline constituting the chemical liquid supply line 701C. Likewise, the rinse liquid supply line 702C may also be equipped with such a heater.

The chemical liquid nozzle 701, the rinse nozzle 702 and the drying accelerator liquid nozzle 703 are supported by a leading end of a nozzle arm 704. A base end of the nozzle arm 704 is supported by a nozzle arm driving device 705 configured to move up and down and rotate the nozzle arm 704. The chemical liquid nozzle 701, the rinse nozzle 702 and the drying accelerator liquid nozzle 703 can be placed at a certain position above the wafer W in the radial direction of the wafer W (a position with respect to the radial direction of the wafer W) by the nozzle arm moving device 705.

Disposed at a ceiling of the housing 1601 are a wafer sensor 860 configured to detect a presence or absence of the wafer W on the rotary table 100 and one or more infrared thermometers 870 (only one is illustrated) configured to detect a temperature of the wafer W (or a temperature of the processing liquid on the wafer W). In a configuration in which multiple infrared thermometers 870 are provided, it is desirable that the individual infrared thermometers 870 are configured to detect a temperature of regions of the wafer W corresponding to the heating zones 143-1 to 143-10, respectively.

Now, with reference to a time chart of FIG. 8, an operation of the processing unit 16 will be explained for a case where the processing unit 16 performs a chemical liquid cleaning processing. The operation to be described below can be carried out under the control of the control device 4 (controller 18) shown in FIG. 1 which controls operations of the various kinds of components of the processing unit 16.

Figure 8:
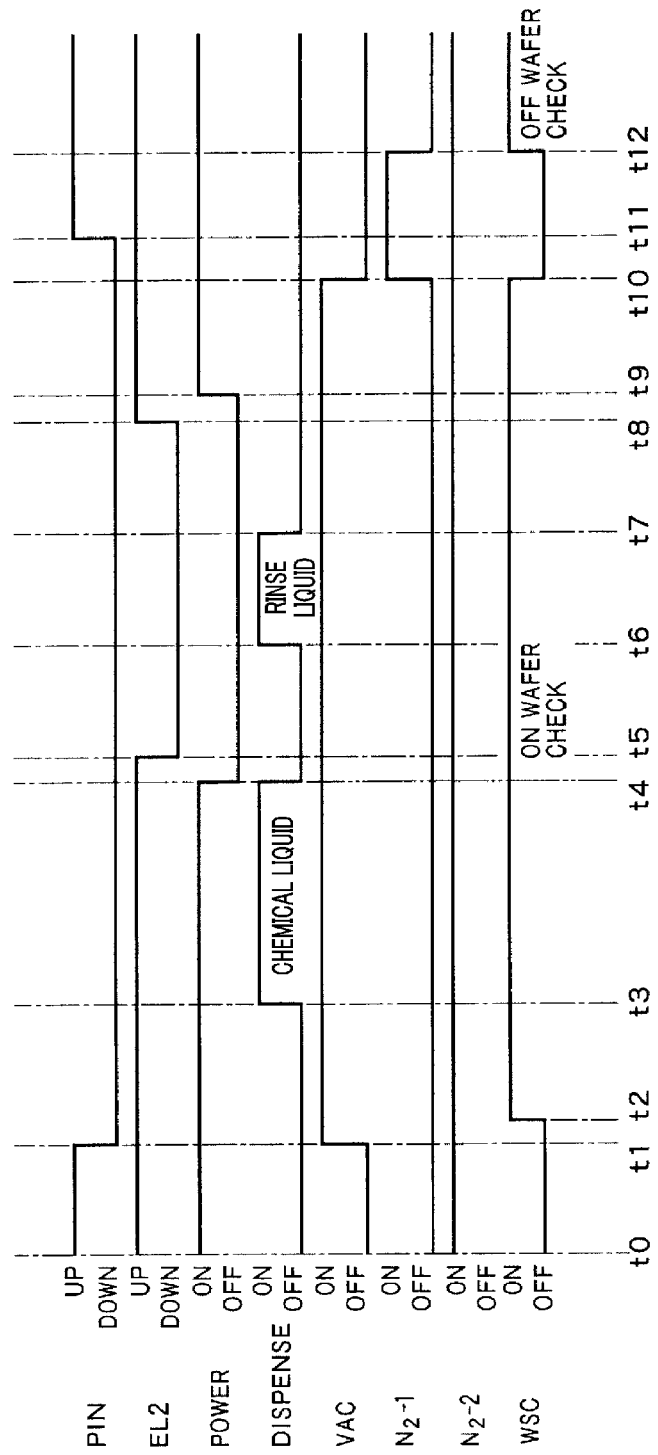
FIG. 8 is a time chart for describing example operations of various constituent components of the processing unit.

On the time chart of FIG. 8, a horizontal axis represents a lapse of time. A vertical axis shows the following items in sequence from the top.

"PIN" denotes a height position of the lift pin 211. "UP" indicates that the lift pin 211 is located at the transfer position, and "DOWN" indicates that the lift pin 211 is located at the processing position.

"EL2" denotes a height position of the second electrode unit 161B. "UP" indicates that the second electrode unit 161B is located at a height position where it is in contact with the first electrode unit 161A, and "DOWN" indicates that the second electrode unit 161B is located at a height position distanced apart from the first electrode unit 161A.

"POWER" denotes a state of the power feed to the heater 142 from the power feeder 300. "ON" indicates a state where the power feed is being performed, and "OFF" indicates a state in which the power feed is stopped.

"DISPENSE" indicates a state of the chemical liquid nozzle 701 in the chemical liquid processing and a state of the rinse liquid nozzle 702 in the rinsing processing. "ON" indicates that the supply of the liquid is being performed, and "OFF" indicates that the supply of the liquid is stopped.

"VAC" denotes a state of the application of the suction force from the suction device 154 to the bottom surface suction path groove 121W of the attraction plate 120. "ON" indicates that the suctioning is being performed, and "OFF" indicates that the suctioning is stopped.

"$N_2$-1" indicates a state of the supply of the purge gas from the purge gas supply device 155 into the bottom surface suction path groove 121W of the attraction plate 120. "ON" indicates that the supply of the purge gas is being performed, and "OFF" indicates the supply of the purge gas is stopped.

"$N_2$-2" denotes a state of the supply of the purge gas from the purge gas supply device 155 into the bottom surface purge path groove 121G of the attraction plate 120. "ON" indicates that the supply of the purge gas is being performed, and "OFF" indicates the supply of the purge gas is stopped.

"WSC" denotes an operational status of the wafer sensor 860. "ON" indicates a state in which the wafer sensor 860 is detecting the presence or absence of the wafer W on the attraction plate 120, and "OFF" indicates a state in which the wafer sensor 860 does not perform the detection. Further, "On Wafer Check" is a detecting operation of checking whether the wafer W is present on the attraction plate 120. "OFF Wafer Check" is a detecting operation of checking whether the wafer W is removed from the attraction plate 120 completely.

[Carry-In Process (Holding Process) for Wafer W]

The arm of the substrate transfer device 17 (see FIG. 1) advances into the processing unit 16 to be placed directly above the attraction plate 120, and the lift pins 211 are placed at the transfer position (times t0 to t1). In this state, the arm of the substrate transfer device 17 is lowered. Accordingly, the wafer W is distanced apart from the arm by being placed on the upper ends of the lift pins 211. Then, the arm of the substrate transfer device 17 is retreated out of the processing unit 16. The lift pins 211 are lowered down to the processing position, and in the meanwhile, the wafer W is placed on the top surface 120A of the attraction plate 120 (time t1).

Subsequently, as the suction device 154 is operated, the attraction plate 120 is attracted to the hot plate 140, and the wafer W is attracted to the attraction plate 120 (time t1). Thereafter, an inspection by the wafer sensor 860 to inspect whether the wafer W is appropriately attracted to the attraction plate 120 is begun (time t2).

The purge gas (e.g., $N_2$ gas) is constantly supplied to the outermost recess region 125G on the top surface of the attraction plate 120 from the purge gas supply device 155. Accordingly, even if there exists a gap between the contact surfaces of the peripheral portion of the bottom surface of the wafer W and the peripheral portion of the attraction plate 120, the processing liquid is suppressed from being introduced somewhere between the peripheral portion of the wafer W and the peripheral portion of the attraction plate 120 through this gap.

The second electrode unit 161B is placed at the raised position and the first electrodes 164A of the first electrode unit 161A and the second electrodes 164B of the second electrode unit 161B are in contact with each other from a time before the carry-in of the wafer W is begun (before time t0). The power is fed to the heater 142 of the hot plate 140 from the power feeder 300, and the heater 142 of the hot plate 140 is in a pre-heated state.

[Wafer Heating Process]

Once the wafer W is attracted to the attraction plate 120, the power fed to the heater 142 of the hot plate 140 is adjusted to allow the temperature of the hot plate 140 to reach a preset temperature (a temperature where the wafer W on the attraction plate 120 is heated to a temperature appropriate for a processing performed afterwards) (times t1 to t3).

[Chemical Liquid Processing Process (Including Puddle Forming Process and Agitating Process)]

Subsequently, the chemical liquid nozzle 701 is placed directly above the central portion of the wafer W by the nozzle arm of the processing liquid supply 700. In this state, the chemical liquid whose temperature is adjusted is supplied onto the front surface (top surface) of the wafer W from the chemical liquid nozzle 701 (times t3 to t4). The supply of the chemical liquid is continued until the liquid surface LS of the chemical liquid becomes higher than the top surface of the wafer W. At this time, the upper portion 181 of the periphery cover body 180 serves as the embankment, suppressing the chemical liquid from flowing over to the outside of the rotary table 100.

During the supply of the chemical liquid or after the supply of the chemical liquid, the rotary table 100 is rotated in the forward direction and in the backward direction alternately (for example, by about 180 degrees). Accordingly, the chemical liquid is agitated, and the reaction between the front surface of the wafer W and the chemical liquid can be uniformed within the surface of the wafer W.

In general, the temperature of the peripheral portion of the wafer W tends to be reduced due to an influence of an air flow attracted into the liquid recovery cup. Among the multiple number of heater elements 142E of the heater 142, the power to be fed to the heater elements 142E in charge of the heating of the peripheral region of the wafer W (the heating zones 143-1 to 143-4) may be increased. As a result, the temperature of the wafer W can be uniformed within the surface thereof, so that the reaction between the front surface of the wafer W and the chemical liquid can be uniformed within the surface of the wafer W.

During this chemical liquid processing, the control over the power to be fed to the heater 142 can be carried out based on the detection value of the temperature sensor 146 provided at the hot plate 140. Instead, the control over the power to be fed to the heater 142 may be performed based on the detection value of the infrared thermometer 870 which detects the surface temperature of the wafer W. By using the detection value of the infrared thermometer 870, a more accurate temperature control of the wafer W can be achieved. The control over the power to be fed to the heater 142 may be performed based on the detection value of the temperature sensor 146 in an early stage of the chemical liquid processing, and then, based on the detection value of the infrared thermometer 870 in a later stage thereof.

[Chemical Liquid Scattering Process (Chemical Liquid Removing Process)]

Upon the completion of the chemical liquid processing, the power feed to the heater 142 from the power feeder 300 is first stopped (time t4), and the second electrode unit 161B is moved to the lowered position (time t5). By stopping the power feed first, generation of a spark between the electrodes can be avoided when the second electrode unit 161B is lowered.

Then, by rotating the rotary table 100 at a high speed, the chemical liquid on the wafer W is scattered outwards by the centrifugal force (times t5 to t6). Since the inner peripheral surface 185 of the upper portion 181 of the periphery cover body 180 is inclined, the chemical liquid existing at the inner side than the upper portion 181 in the radial direction (including the chemical liquid on the wafer W) is smoothly removed completely. The scattered chemical liquid falls down through the passageway 190 between the rotary cup 188 and the periphery cover body 180 to be received by the liquid recovery cup 800. At this time, the first and second movable cup components 802 and 803 are located at the appropriate positions so that the scattered chemical liquid is guided into the drain passageway (one of the first drain passageway 806, the second drain passageway 807 and the third drain passageway 808) suitable for the kind of the chemical liquid.

[Rinsing Process]

Subsequently, while rotating the rotary table 100 at a low speed, the rinse nozzle 702 is placed directly above the central portion of the wafer W, and the rinse liquid is supplied from the rinse nozzle 702 (times t6 to t7). Accordingly, the chemical liquid remaining at the inner side than the upper portion 181 in the radial direction (including the chemical liquid left on the wafer W) is completely washed away by the rinse liquid.

The rinse liquid supplied from the rinse nozzle 702 may be a rinse liquid of a room temperature or a heated rinse liquid. When supplying the heated rinse liquid, it is possible to suppress the temperatures of the attraction plate 120 and the hot plate 140 from being declined. The heated rinse liquid may be supplied from a factory supply system. Instead, a heater (not shown) may be provided on the rinse liquid supply line connected between the rinse liquid source 702A and the rinse nozzle 702 to heat the rinse liquid of the room temperature.

[Scattering Drying Process]

Then, by stopping the discharge of the rinse liquid from the rinse nozzle 702 while rotating the rotary table 100 at a high speed, the whole rinse liquid remaining at the inner region than the upper portion 181 in the radial direction (including the rinse liquid left on the wafer W) is scattered outwards by a centrifugal force (times t7 to t8). Accordingly, the wafer W is dried.

Between the rinsing processing and the drying processing, the drying accelerator liquid may be supplied onto the wafer W to replace the whole rinse liquid remaining at the inner region than the upper portion 181 in the radial direction (including the rinse liquid remaining on the wafer W) with the drying accelerator liquid. Desirably, the drying accelerator liquid may have higher volatility and lower surface tension as compared to the rinse liquid. The drying accelerator liquid may be, by way of example, but not limitation, IPA (Isopropyl Alcohol).

After the scattering drying process, a heating/drying process of heating the wafer W may be performed. In this case, the rotation of the rotary table 100 is stopped first. Then, the second electrode unit 161B is moved to the raised position (time t8). Then, the power is fed from the power feeder 300 to the heater 142 (time t9). Accordingly, the temperature of the wafer W is raised (desirably, at a high speed), and the rinse liquid (or the drying accelerator liquid) remaining at the peripheral portion of the wafer W and the vicinity thereof is removed by being evaporated. Since the front surface of the wafer W is dried sufficiently by performing the scattering drying process with the aforementioned IPA, the heating/drying by the heater 142 need not be performed. That is, on the time chart of FIG. 8, the operations from the time between the times t7 and t8 and the time between the times t10 to t11 may be omitted.

[Wafer Carry-Out Process]

Thereafter, by switching the switching device (three-way valve) 156, the connection of the suction line 153W to the suction device 154 is cut, and the suction line 153W is connected to the purge gas supply device 155. Accordingly, the purge gas is supplied into the plate bottom surface suction path groove 121P, and, further, the purge gas is supplied into the recess region 125W on the top surface 120A of the attraction plate 120 through the substrate bottom surface suction path groove 121W. As a result, the attraction of the wafer W to the attraction plate 120 is released (time t10).

Along with the aforementioned operation, the attraction of the attraction plate 120 to the hot plate 140 is also released. Since the attraction of the attraction plate 120 to the hot plate 140 need not be released whenever the processing on the single sheet of wafer W is completed, a pipeline system in which this release of the attraction is not performed may be used.

Subsequently, the lift pins 211 are raised to the transfer position (time t11). Since the attraction of the wafer W to the attraction plate 120 is released through the aforementioned purging, the wafer W can be easily separated from the attraction plate 120. Therefore, the damage on the wafer W can be avoided.

Then, the wafer W placed on the lift pins 211 is lifted and taken by the arm of the substrate transfer device 17 (see FIG. 1) to be carried to the outside of the processing unit 16 (time t12). Thereafter, it is inspected by the wafer sensor 860 whether the wafer W does not exist on the attraction plate 120. Through the above-stated operations, a series of processings upon the single sheet of wafer W is ended.

The chemical liquid used in the chemical liquid cleaning processing may be, by way of non-limiting example, SC1, SPM (sulfuric acid hydrogen peroxide mixture), $H_3PO_4$ (phosphoric acid aqueous solution) or the like. As an example, the temperature of the SC1 is in the range from a room temperature to 70° C.; the temperature of the SPM is in the range from 100° C. to 120° C.; and the temperature of the $H_3PO_4$ is in the range from 100° C. to 165° C. When the chemical liquid is supplied at a temperature higher than the room temperature, the aforementioned exemplary embodiment is advantageous.

According to the above-described exemplary embodiment, since the chemical liquid is heated through heat conduction within a solid, it is possible to control a temperature of the chemical liquid existing on the wafer W with high accuracy. Further, in the rinsing processing and the scattering/drying processing, a power feed system for the heater 142 is separated, so that the rotary table 100 can be rotated at a high speed. Therefore, the rinsing processing and the scattering/drying can be performed efficiently.

Moreover, according to the above-descried exemplary embodiment, since the rotary table 100 can be rotated to some extent without needing to separate the power feed system for the heater 142, the puddle of the processing liquid can be agitated while being heated. Therefore, uniformity of the processing within the surface of the wafer W can be improved.

By using the above-described processing unit 16, a plating processing (particularly, an electroless plating processing) may be performed as the liquid processing. In case of performing the electroless plating processing, a pre-cleaning process (chemical liquid cleaning process), a plating process, a rinsing process, a post-cleaning process (chemical liquid cleaning process), an IPA replacement process, a scattering drying process (a subsequent heating/drying process when necessary) are performed in sequence. In the plating process among these processes, an alkaline chemical liquid (electroless plating liquid) having a temperature ranging from, e.g., 50° C. to 70° C. is used as the processing liquid. Processing liquids (chemical liquids and rinse liquids) used in the pre-cleaning process, the rinsing process, the post-cleaning process and the IPA replacement process are all of a room temperature. Thus, in the plating process, the same process as the wafer heating process and the chemical liquid processing process needs to be performed. In the pre-cleaning process, the rinsing process, the post-cleaning process and the IPA replacement process, the necessary processing liquids need to be supplied onto the top surface of the wafer W attracted to the attraction plate 120 while rotating the rotary table in the state that the first electrode 164A and the second electrode 164B are spaced apart from each other. Here, enough nozzles and processing liquid sources to supply the necessary processing liquids are provided in the processing liquid supply 700.

Now, referring to FIG. 13, another configuration example of the processing unit will be discussed. In the configuration example shown in FIG. 13, a sub-heater 900 having the substantially same planar shape as that of the heater 142 is provided at a bottom surface of the heater 142. Like the heater 142, the sub-heater 900 may be composed of a plane-shaped heater, for example, a polyimide heater. Further, it is desirable to provide an insulating film made of a polyimide film between the heater 142 and the sub-heater 900 which are made of the polyimide heaters.

Like the heater 142, a multiple number of heating zones may be set in the sub-heater 900, and the heating zones may be controlled individually. A single heating zone may be set in the heater 142, and the entire region of the heater 142 may be controlled to generate heat uniformly.

Now, a power feed device for the sub-heater 900 will be explained. The power feed device has a contact type power transmission device. The power transmission device is configured to feed the power to the sub-heater 900 even when the rotary table 100 is continuously rotated in one direction (at this time, the power feed to the heater 142 via the switching device 160 cannot be made). The power transmission device is configured to be arranged coaxially with the rotary joint 151, and, desirably, mount to or formed as a single body with the rotary joint 151.

Figure 14A:
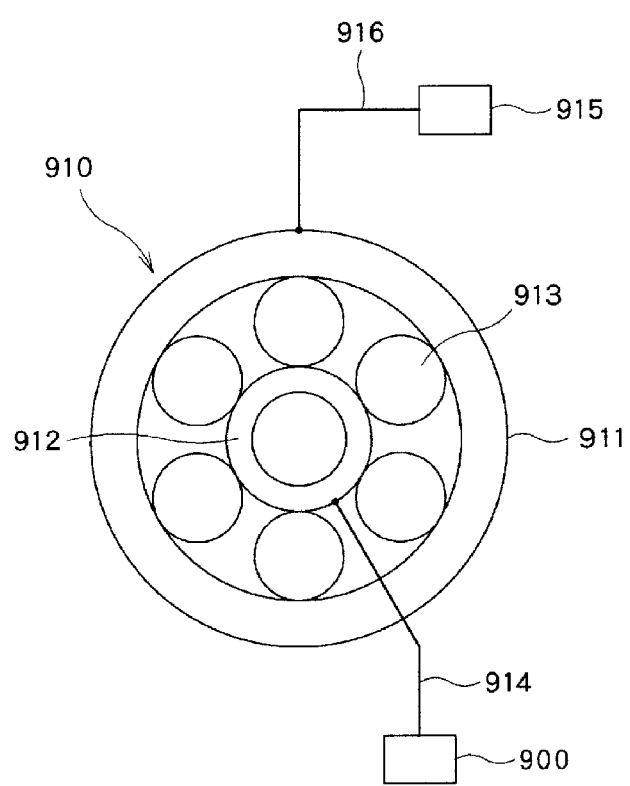
FIG. 14A is a schematic diagram for describing a principle of a first configuration example of a power transmission device for a power feed to a sub-heater provided in the processing unit shown in FIG. 13.

A power transmission device 910 according to a first configuration example will be explained with reference to FIG. 14A illustrating an operational principle thereof and an axial cross sectional view of FIG. 14B. As depicted in FIG. 14A, the power transmission device 910 has a configuration similar to that of a rolling shaft bearing (a ball or a roller bearing), and includes an outer race 911, an inner race 912 and a plurality of rolling bodies (for example, balls) 913. The outer race 911, the inner race 912 and the rolling bodies 913 are made of a conductive material (conductor). Desirably, an appropriate pre-load is applied between the constituent components 911, 912 and 913 of the power transmission device 910. Accordingly, more stable conduction between the outer race 911 and the inner race 912 via the rolling bodies 913 can be achieved.

Figure 14B:
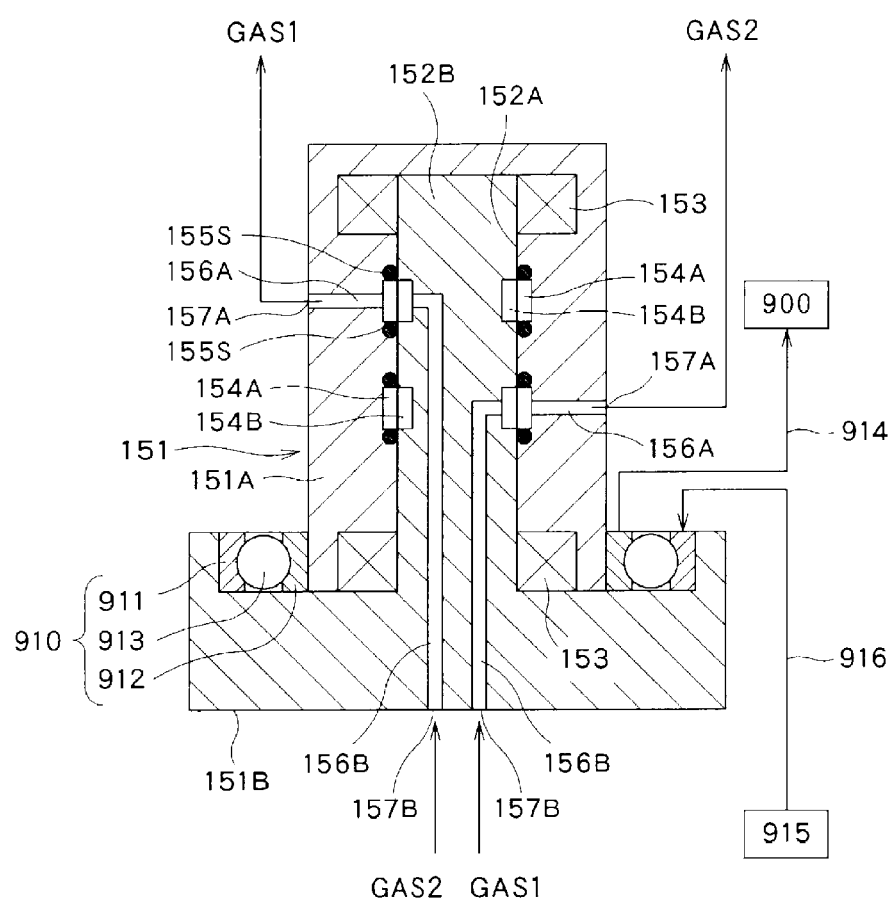
FIG. 14B is a schematic cross sectional view of the first configuration example of the power transmission device for the power feed to the sub-heater provided in the processing unit shown in FIG. 13, taken along an axis line.

A specific example of the rotary joint 151, to which the power transmission device 910 having the above-described operational principle is provided, is illustrated in FIG. 14B. The rotary joint 151 includes a lower piece 151B fixed to a frame provided within a housing 1601 or fixed to a bracket fixed thereto (both the frame and the bracket are not illustrated); and an upper piece 151A fixed to the rotary table 100 or a member (not shown) configured to be rotated along with the rotary table 100.

Though the configuration of the rotary joint 151 shown in FIG. 14B is commonly known in the art, it will be briefly explained here. A columnar central protrusion 152B of the lower piece 151B is inserted in a cylindrical central hole 152A of the upper piece 151A. The central protrusion 152B is supported at the upper piece 151A via a pair of bearings 153. Circumferential grooves 154A are formed at an inner peripheral surface of the central hole 152A. The number of the circumferential grooves 154A depends on the number of the kinds of the gases used (two in FIG. 14B (GAS1 and GAS2), but not limited thereto). Seal rings 155S for suppressing the leak of the gas is provided at both sides of each circumferential groove 154A. Gas passages 156A respectively communicating with the circumferential grooves 154A are formed within the upper piece 151A. An end portion of each gas passage 156A is configured as a gas outlet port 157A. A plurality of circumferential grooves 154B is provided at an outer peripheral surface of the central protrusion 152B to be located at axial positions respectively corresponding to the plurality of circumferential grooves 154A. Gas passages 156B respectively communicating with the circumferential grooves 154B are formed within the lower piece 151B. An end portion of each gas passage 156B is configured as a gas inlet port 157B.

According to the configuration shown in FIG. 14B, even when the upper piece 151A and the lower piece 151B are rotated, a gas can be flown between the gas inlet port 157B and the gas outlet port 157A without a leak of the gas substantially. A suction force can also be delivered between the gas inlet port 157B and the gas outlet port 157A.

The power transmission device 910 is provided between the upper piece 151A and the lower piece 151B of the rotary joint 151. In the example of FIG. 14B, the outer race 911 is fitted (for example, press-fitted) into a cylindrical recess portion of the lower piece 151B, and a columnar outer peripheral surface of the upper piece 151A is fitted (for example, press-fitted) into the inner race 912. The outer race 911 and the lower piece 151B, and the upper piece 151A and the inner race 912 are electrically insulated in an appropriate way. The outer race 911 is electrically connected with a power supply (or a power feed controller) 915 via a wire 916, and the inner race 912 is electrically connected with the sub-heater 900 via a wire 914. Further, in the example of FIG. 14B, the inner race 912 is a rotary member configured to be rotated as one body with the rotary table 100, and the outer race 911 is a non-rotary member. The power supply 915 may be a part of the power feeder 300 shown in FIG. 13.

Further, in the configuration shown in FIG. 14B, by providing the rolling shaft bearings of the power transmission device 910 in multiple levels in an axial direction, a multi-channel power feed may be performed. In this case, a multiple number of heating zones may be provided in the sub-heater 900, and each heating zone may be power-fed independently.

Figure 14C:
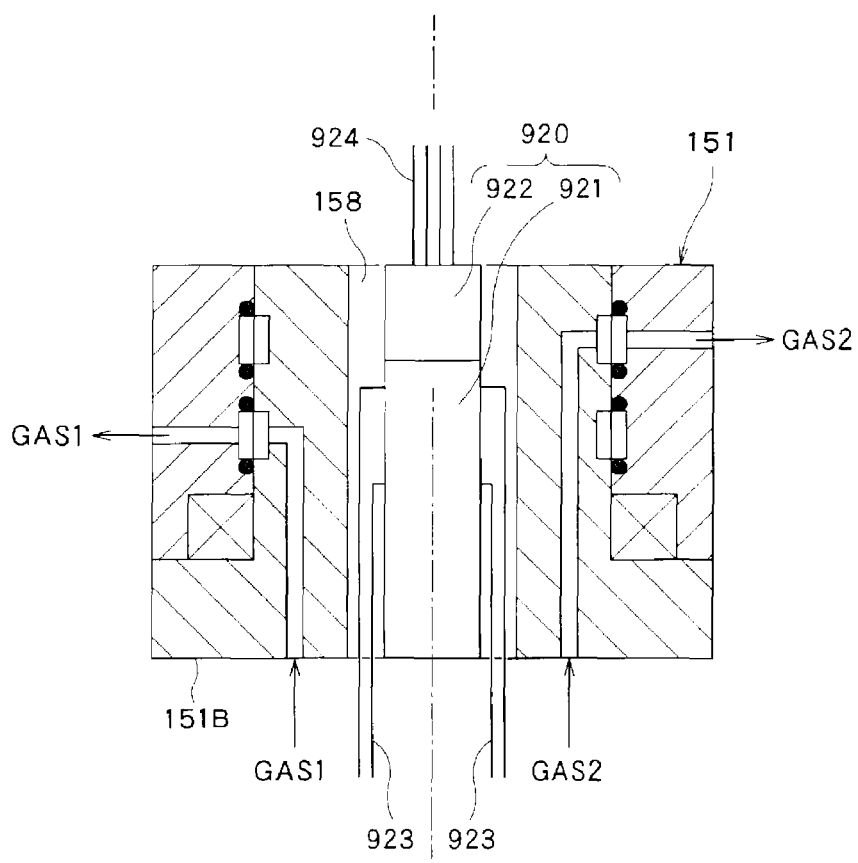
FIG. 14C is a schematic cross sectional view of a second configuration example of the power transmission device for the power feed to the sub-heater provided in the processing unit shown in FIG. 13, taken along the axis line.

Now, a power transmission device 920 according to the second configuration example will be described with reference to FIG. 14C. The power transmission device 920 shown FIG. 14C is composed of a commonly known slip ring and configured to be capable of carrying out the multi-channel power feed. The slip ring includes a brush and a rotary ring as a conductor. The slip ring is composed of a fixed part 921 and a rotary part 922. The fixed part 921 is fixed to the frame provided within the housing 1601 or fixed to the bracket fixed thereto (both are not shown). The rotary part 922 is fixed to the rotary table 100 or the member (not shown) configured to be rotated along with the rotary table 100. Provided on a side peripheral surface of the fixed part 921 is a plurality of terminals to which a plurality of wires 923, which are electrically connected with the power supply or the power feed controller (not shown), is connected. A plurality of wires 924 respectively communicating with the plurality of terminals extends from an end surface of the rotary part 922 in the axial direction to be electrically connected to the sub-heater 900 (see FIG. 2).

In the configuration example of FIG. 14C, the lower piece 151B of the rotary joint 151 is configured as a hollow member having a through hole 158 at a center thereof. The power transmission device 920 composed of the slip ring is accommodated within the through hole 158. The same as in the configuration example of FIG. 14B, the lower piece 151B of the rotary joint 151 is fixed to the frame provided within the housing 1601 or fixed to the bracket fixed thereto (both the frame and the bracket are not shown). Further, the upper piece 151A of the rotary joint 151 is fixed to the rotary table 100 or the member (not shown) configured to be rotated along with the rotary table 100.

The power feed device may be composed of wireless (non-contact type) power transmission device such as magnetic resonance type or an electromagnetic induction type using magnetic coupling (such a power transmission devices themselves are known in the art). In such a case, the wireless power transmission device is equipped with, as schematically illustrated in FIG. 13, a power transmitting coil 903 and a power receiving coil 902 which extend in the circumferential direction while facing each other with a gap therebetween. A ferrite sheet (not shown) for collecting a magnetic flux and suppressing a magnetic leakage is provided around the power transmitting coil 903 and the power receiving coil 902. The power transmitting coil 903 may be mounted to a non-rotary member, for example, the stationary outer cup component 801, and the power receiving coil 902 may be mounted to a rotary member, for example, the support plate 170. The power receiving coil 902 is electrically connected to the sub-heater 900 via a wire 904. The power transmitting coil 903 is electrically connected to a power supply (or the power feed controller) 906 via a wire 905.

Figure 13:
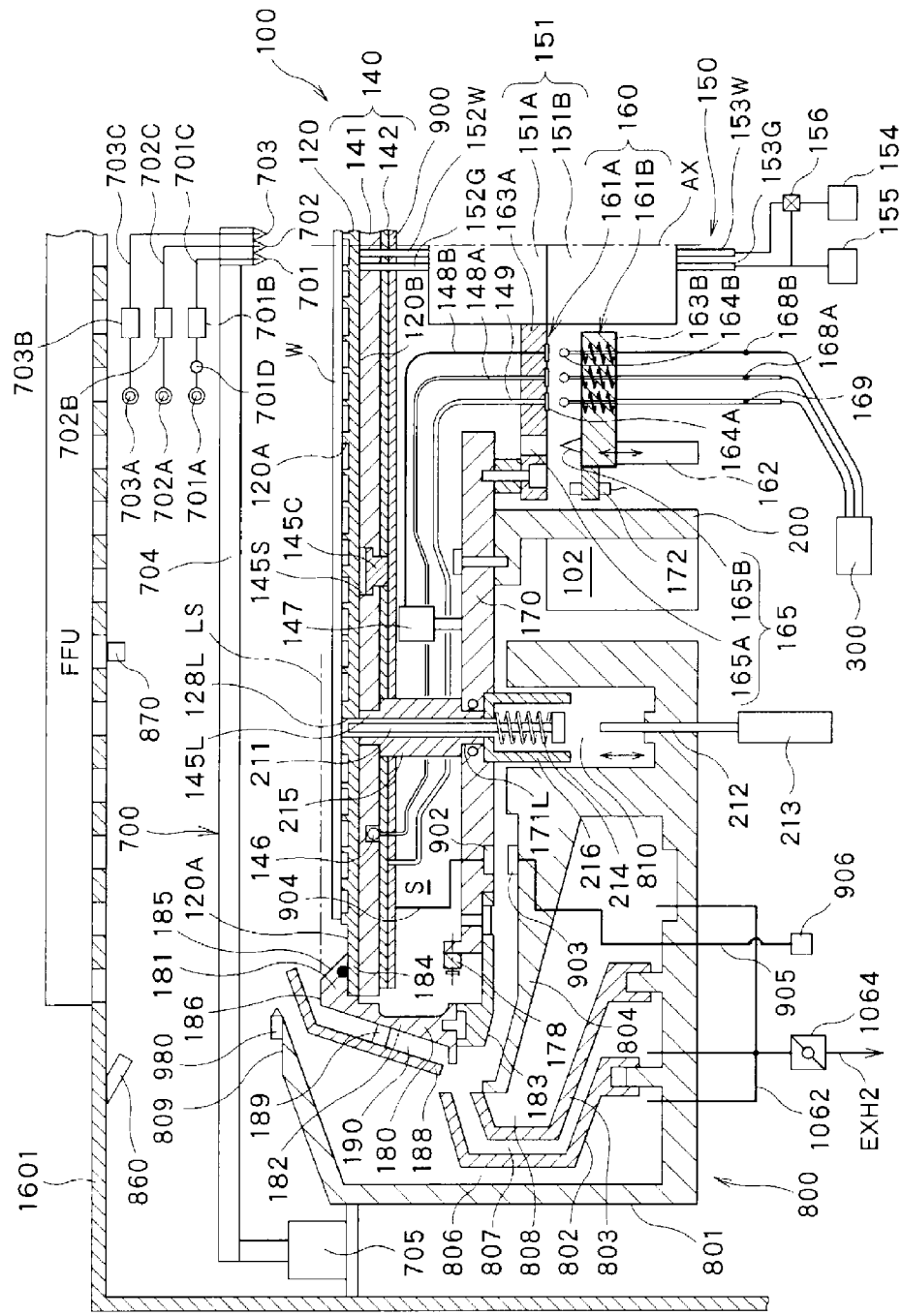
FIG. 13 is a schematic cross sectional view illustrating another configuration example of the processing unit provided in the substrate processing apparatus.

In case of using the non-contact type power transmission device schematically shown in FIG. 13, by providing multiple sets of the power transmitting coil 903 and the power receiving coil 902, for example, the multi-channel power feed can be carried out.

Further, a distributor configured to distribute the power transmitted through the power transmission device to multiple channels and a control module configured to control the power feed to each heating zone (both the distributor and the control module are not illustrated) may be provided at an appropriate position within the space S between the hot plate 140 and the support plate 170. With this configuration, even if the power transmission device is designed to correspond to a single channel, the multiple number of heating zones can be provided in the sub-heater 900, and an independent power feed to each heating zone can be carried out.

The power feed device configured to feed the power to the sub-heater 900 is not limited to the aforementioned examples, but the power feed device may use any of various well-known power transmission devices having a power transmitting member and a power receiving member configured to be rotated relative to each other while transmitting a power of a required level.

If the power transmission device is configured to be capable of carrying out the multi-channel power feed, one or more transmission channels may be used to transmit a control signal or a detection signal.

Moreover, the power transmission device shown in FIG. 13 and FIG. 14A to FIG. 14C may perform all or a part of a function of feeding the power to the main heater 142 via the switching device 160 as stated with reference to FIG. 2 and FIG. 11, and the function of transmitting the control/detection signals. In this case, the switching device 160 may be completely omitted, or a part of the components of the switching device 160 may be omitted.

An operation of the processing unit 16 shown in FIG. 13 is performed in the same way as the above-stated operation of the processing unit 16 in FIG. 2, except for the power feed to the sub-heater 900.

In the exemplary embodiment, the sub-heater 900 is always power-fed. In the exemplary embodiment, the power supplied to the heater (main heater) 142 via the switching device 160 is larger than the power supplied to the sub-heater 900 via the power transmission devices 910 and 920 shown in FIG. 14A to FIG. 14C or the power transmission device 902 and 903 shown in FIG. 13. That is, the main function of the sub-heater 900 is to suppress the temperature decrease of the hot plate 140 when the heating by the heater 142 cannot be performed. A caloric power of the sub-heater 900 may be substantially equal to a caloric power of the heater 142.

Further, in the exemplary embodiment, while the processing unit 16 (substrate processing system 1) is being operated, the power supplied to the sub-heater 900 is maintained constant, and a temperature control over the wafer W is carried out by adjusting the power to be supplied to the heater 142. By adjusting the power fed to the sub-heater 900, however, the sub-heater 900 may be used for the temperature control over the wafer W.

In addition, in the above-described exemplary embodiment, the heater (main heater) 142, that is, a first heater element and the sub-heater 900, that is, a second heater element to which the power is fed individually by the independent power feeding systems are provided. However, the exemplary embodiment is not limited thereto. By way of example, without providing the sub-heater 900, there may be adopted a configuration in which the power may be supplied to the main heater 142 by a first power feeding system including the aforementioned switching device 160 and by a second power feeding system including the aforementioned power transmission devices 910 and 920 or the power transmission devices 902 and 903. In such a case, the power feed to the main heater 142 may be performed by selected one of the first power feeding system and the second power feeding system.

Now, examples of a relationship between elements related to a temperature control of the heater will be explained with reference to FIG. 15 and FIG. 16.

First, an example of FIG. 15 will be explained. In the example of FIG. 15, the power is supplied and a control signal (or the detection signal) is transmitted by using the switching device 160 configured to perform the above-described connection/disconnection operation and the power transmission device 910 (or 920) configured to feed the power always.

Detection signals of N number (for example, ten, the same as the number of the heating zones) of the temperature sensors 146 (for example, thermocouples TC1) are sent to a temperature controller TR1 embedded in the power feeder 300 (see FIG. 13) via the first electrodes 164AC for control signal communication and the second electrodes 164BC of the switching device 160. Further, in this case, the power feeder 300 includes the aforementioned power supply 915.

The temperature controller (regulator) TR1 is configured to calculate the powers to be supplied to the individual heater elements 142E of the heater 142 based on the received detection signals of the temperature sensors TC1. Further, the temperature controller TR1 is configured to supply the powers corresponding to the calculated powers to the heater elements 142E via the first electrodes 164AP for heater power feed and the second electrodes 164BC of the switching device 160.

If an abnormal temperature rise of the hot plate 140 is detected by any one of M number of (for example, three) thermo switches 147, this detection result is sent to an interlock controller I/L via one or more transmission channels of the power transmission device 910. The interlock controller I/L is configured to control the temperature controller TR1 to stop the power feed to the heater 142.

A detection signal of a temperature sensor TC2 (not illustrated except in FIG. 15) such as a thermocouple provided in the hot plate 140 is sent to a temperature controller TR2 (regulator) embedded in the power feeder 300 by using one or more transmission channels of the power transmission device 910. The temperature controller TR2 is configured to calculate the power to be supplied to the sub-heater 900 based on the received detection signal of the temperature sensor TC2. The temperature controller TR2 is configured to supply the power corresponding to the calculated power to the sub-heater 900 via the power transmission device 910. Alternatively, as stated above, a constant power may be supplied to the sub-heater 900.

Now, the example of FIG. 16 will be explained. In the example of FIG. 16, the power is supplied and the control signal (or the detection signal) is transmitted by the switching device 160 configured to perform the above-described connection/disconnection operation and by the non-contact type power transmission devices 902 and 903. Below, only distinctive features from the example of FIG. 15 will be discussed.

Figure 16:
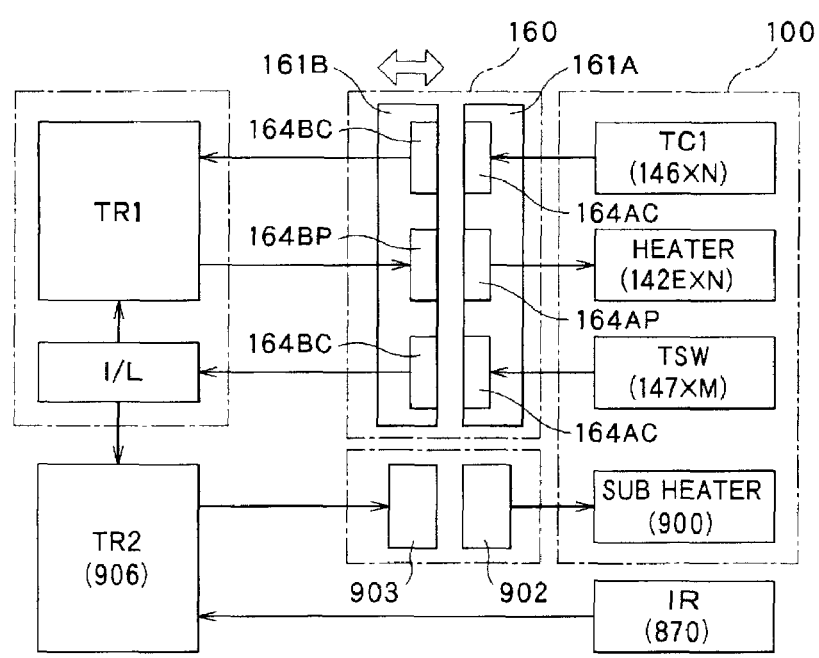
FIG. 16 is a block diagram illustrating another example relationship between the components concerned with the temperature control over the heater.

In the example of FIG. 16, the detection signal of the abnormal temperature rise from the thermo switch 147 is sent to the temperature controller TR1 embedded in the power feeder 300 via the first electrodes 164AC for control signal communication and the second electrodes 164BC of the switching device 160. Further, in the example of FIG. 16, the surface temperature of the wafer W or the attraction plate 120 (when there is no wafer W) is detected by an infrared thermometer 870 instead of the temperature sensor TC2 such as the thermocouple provided in the hot plate 140. Based on this detection result, the temperature controller TR2 is configured to supply the power to the sub-heater 900 via the power transmission devices 902 and 903.

Figure 15:
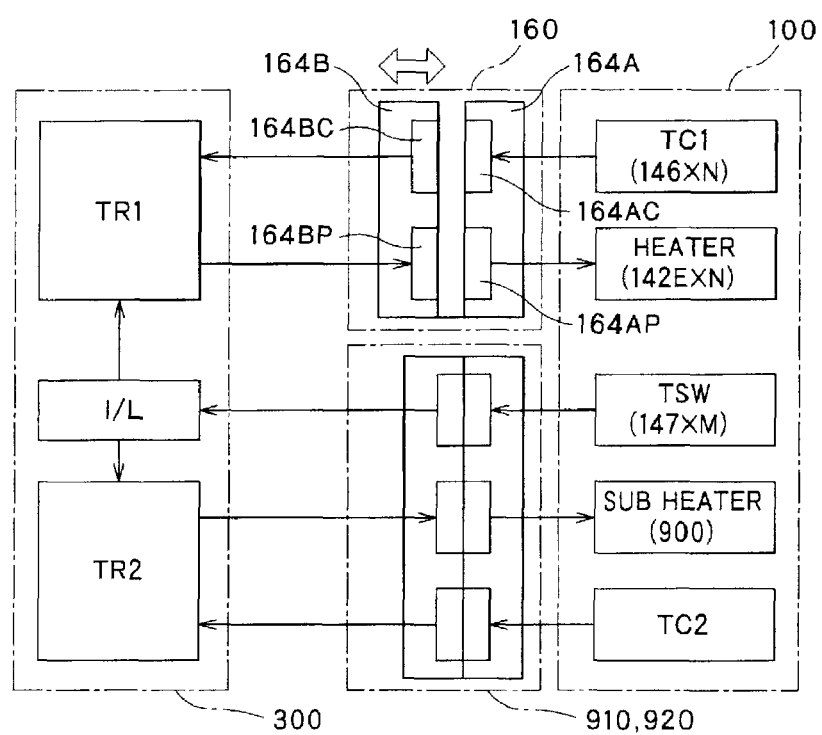
FIG. 15 is a block diagram illustrating an example relationship between components concerned with a temperature control over the heater.

Moreover, though not shown in FIG. 15 and FIG. 16, when it is required to take earth, one transmission channel of the power transmission device 910 (920) or the switching device 160 may be used.

In the exemplary embodiment, a power may be supplied to the sub-heater 900 continuously while all the aforementioned processes, that is, the wafer carry-in process (holding process), the wafer heating process, the chemical liquid processing process (including the puddle forming process and the agitating process), the chemical liquid scattering process (chemical liquid removing process), the rinsing process, the scattering/drying process and the wafer carry-out process are being performed. In such a case, different controls may be performed within a period (contact period) during which the first electrode 164A and the second electrode 164B of the switching device 160 are in contact with each other to thereby allow the power to be fed to the heater (main heater) 142 and within a period (separation period) during which the first electrode 164A and the second electrode 164B are separated from each other.

For example, within the contact period, the temperature control of the hot plate 140 of the rotary table 100 may be carried out by controlling a power to be supplied to the heater 142, and the constant power may be continuously supplied to the sub-heater 900. Further, within the separation period, the temperature control of the hot plate 140 may be carried out by controlling a power to be supplied to the sub-heater 900.

Within the contact period, the temperature control of the hot plate 140 of the rotary table 100 may be carried out by controlling both the power to be supplied to the heater 142 and the power to be supplied to the sub-heater 900.

According to another exemplary embodiment, within the contact period, the temperature control of the hot plate 140 may be performed by controlling the power to be supplied to the heater 142 without supplying a power to the sub-heater 900.

A temperature of the hot plate 140 within the separation period may be different from, for example, lower than a temperature of the hot plate 140 in the chemical liquid processing process (this is a part of the contact period).

Figure 17:
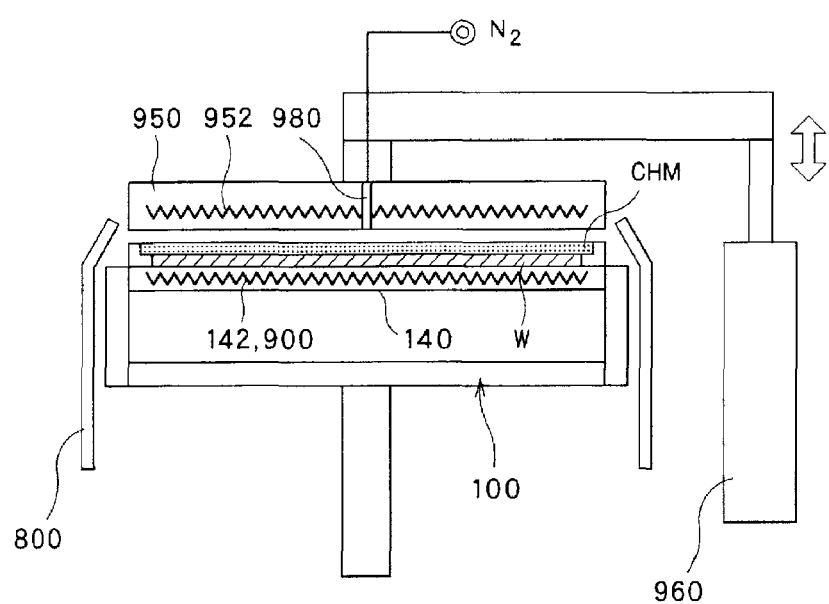
FIG. 17 is a schematic diagram illustrating an exemplary embodiment further including a top plate.

As schematically illustrated in FIG. 17, a circular plate-shaped top plate 950 having a diameter substantially equal to a diameter of the wafer W may be provided within the processing unit 16. The top plate 950 may have a heater 952 embedded therein. The top plate 950 can be moved by a plate moving device 960 between a cover position (a position shown in FIG. 17) close to the wafer held on the rotary table 100 and a standby position sufficiently apart from the wafer W (for example, a position where the nozzle arm 704 can be located above the wafer W). The standby position may be a position directly above the rotary table 100 or a position at an outer side than the liquid recovery cup 800 when viewed from the top.

In the configuration in which the top plate 950 is provided, the top plate 950 is located at the cover position when the aforementioned chemical liquid processing is being performed. That is, the top plate 950 is placed near a liquid surface of a puddle of a chemical liquid CHM covering the wafer W. In this case, contamination within the processing unit 16 caused by the scattering of the chemical liquid components can be suppressed by the top plate 950.

In case that the top plate 950 has the heater 952, the top plate 950 has a function of keeping the wafer W and the chemical liquid on the wafer W warm. Further, since a bottom surface of the top plate 950 is being heated by the heater 952, a vapor (water vapor) generated from the chemical liquid heated on the wafer W does not condense on the bottom surface of the top plate 950. Therefore, since a vapor pressure of a space (gap) between a surface of a liquid film of the chemical liquid and the bottom surface of the top plate 950 is maintained, the evaporation of the chemical liquid is suppressed, and a concentration of the chemical liquid can be maintained within a required range.

The top plate 950 may be equipped with a gas nozzle 980 configured to supply an inert gas, for example, a nitrogen gas ($N_2$ gas) into a space under the top plate 950. Since an oxygen concentration in the space under the top plate 950 can be reduced by the inert gas supplied from the gas nozzle 980, this configuration has many advantages when it is used in various kinds of processings in which an oxidizing atmosphere is not desired.

It should be noted that the above-described exemplary embodiments are not intended to be anyway limiting. The exemplary embodiments can be modified in various ways without departing from the scope and spirit of the following claims.

The substrate as the processing target is not limited to the semiconductor wafer, and various other kinds of substrates such as a glass substrate or a ceramic substrate for use in the manufacture of a semiconductor device may be used.

According to the exemplary embodiments, it is possible to improve accuracy for the control of a substrate temperature in a substrate processing in which the substrate is processed while being held on the rotary table.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a rotary table configured to hold a substrate horizontally;
a rotation driving device configured to rotate the rotary table around a vertical axis;
an electric heater provided at the rotary table to be rotated along with the rotary table and configured to heat the substrate placed on the rotary table;
a power receiving electrode provided at the rotary table to be rotated along with the rotary table and electrically connected to the electric heater;
a power feeding electrode configured to be contacted with the power receiving electrode to supply a power to the electric heater via the power receiving electrode;
an electrode moving device configured to connect and disconnect the power feeding electrode and the power receiving electrode relatively;
a power feeder configured to supply the power to the power feeding electrode;
a processing cup disposed to surround the rotary table, and connected to an exhaust pipeline and a drain pipeline;
at least one processing liquid nozzle configured to supply a processing liquid onto the substrate;
a processing liquid supply device configured to supply the processing liquid to the at least one processing liquid nozzle; and
a controller configured to control the electrode moving device, the power feeder, the rotation driving device and the processing liquid supply device,
wherein the rotary table has an embankment surrounding a peripheral portion of the substrate,
the processing liquid supplied onto the substrate when the substrate is held by the rotary table is blocked by the embankment, to thereby form, on the rotary table, a puddle of the processing liquid having an amount enough to immerse an entire top surface of the substrate, and
the embankment is inclined to be lowered as the embankment approaches an inner portion of the rotary table in a radial direction thereof.

2. The substrate processing apparatus of claim 1,
wherein the rotary table comprises an attraction plate,
the substrate is attracted to a top surface of the attraction plate to be held by the rotary table, and
the electric heater is configured to heat the substrate attracted to the top surface of the attraction plate via the attraction plate from a bottom surface side of the attraction plate.

3. The substrate processing apparatus of claim 2,
wherein an area of the rotary table viewed from a direction of the vertical axis is equal to or larger than an area of the substrate.

4. The substrate processing apparatus of claim 2, further comprising:
a suction line extending through an inside of a rotation shaft of the rotary table,
wherein the rotary table further comprises a base plate,
a suction hole communicating with the suction line is provided at a top surface of the base plate,
the attraction plate is attracted to the base plate by applying a suction force through the suction hole in a state that the attraction plate is placed on the top surface of the base plate, and
the suction force acts on the substrate through a through hole formed through the attraction plate to thereby attract the substrate to the attraction plate.

5. A substrate processing apparatus, comprising:
a rotary table configured to hold a substrate horizontally;
a rotation driving device configured to rotate the rotary table around a vertical axis;
an electric heater provided at the rotary table to be rotated along with the rotary table and configured to heat the substrate placed on the rotary table;
a power receiving electrode provided at the rotary table to be rotated along with the rotary table and electrically connected to the electric heater;
a power feeding electrode configured to be contacted with the power receiving electrode to supply a power to the electric heater via the power receiving electrode;
an electrode moving device configured to connect and disconnect the power feeding electrode and the power receiving electrode relatively;
a power feeder configured to supply the power to the power feeding electrode;
a processing cup disposed to surround the rotary table, and connected to an exhaust pipeline and a drain pipeline;
at least one processing liquid nozzle configured to supply a processing liquid onto the substrate;
a processing liquid supply device configured to supply the processing liquid to the at least one processing liquid nozzle; and
a controller configured to control the electrode moving device, the power feeder, the rotation driving device and the processing liquid supply device,
wherein the rotary table is configured to be rotated within a preset angular range in a state that the power receiving electrode and the power feeding electrode are contacted with each other.

6. A substrate processing apparatus, comprising:
a rotary table configured to hold a substrate horizontally;
a rotation driving device configured to rotate the rotary table around a vertical axis;
an electric heater provided at the rotary table to be rotated along with the rotary table and configured to heat the substrate placed on the rotary table;
a power receiving electrode provided at the rotary table to be rotated along with the rotary table and electrically connected to the electric heater;
a power feeding electrode configured to be contacted with the power receiving electrode to supply a power to the electric heater via the power receiving electrode;
an electrode moving device configured to connect and disconnect the power feeding electrode and the power receiving electrode relatively;
a power feeder configured to supply the power to the power feeding electrode;
a processing cup disposed to surround the rotary table, and connected to an exhaust pipeline and a drain pipeline;
at least one processing liquid nozzle configured to supply a processing liquid onto the substrate;

a processing liquid supply device configured to supply the processing liquid to the at least one processing liquid nozzle; and a controller configured to control the electrode moving device, the power feeder, the rotation driving device and the processing liquid supply device, wherein the electric heater comprises multiple heater elements respectively configured to heat different regions of the substrate, and the controller is configured to control calorific powers of the multiple heater elements individually via the power feeder.

7. A substrate processing apparatus, comprising:

a rotary table configured to hold a substrate horizontally;

a rotation driving device configured to rotate the rotary table around a vertical axis;

an electric heater provided at the rotary table to be rotated along with the rotary table and configured to heat the substrate placed on the rotary table;

a power receiving electrode provided at the rotary table to be rotated along with the rotary table and electrically connected to the electric heater;

a power feeding electrode configured to be contacted with the power receiving electrode to supply a power to the electric heater via the power receiving electrode;

an electrode moving device configured to connect and disconnect the power feeding electrode and the power receiving electrode relatively;

a power feeder configured to supply the power to the power feeding electrode;

a processing cup disposed to surround the rotary table, and connected to an exhaust pipeline and a drain pipeline;

at least one processing liquid nozzle configured to supply a processing liquid onto the substrate;

a processing liquid supply device configured to supply the processing liquid to the at least one processing liquid nozzle;

a controller configured to control the electrode moving device, the power feeder, the rotation driving device and the processing liquid supply device; and a first power transmission device and a second power transmission device configured to supply the power to the electric heater, wherein the first power transmission device comprises the power receiving electrode and the power feeding electrode configured to be connected to or disconnected from each other by the electrode moving device, the second power transmission device comprises a fixed member and a rotary member configured to be rotated relative to each other, the second power transmission device is configured to supply the power from the fixed member to the rotary member even when the rotary member is being continuously rotated with respect to the fixed member, the rotary member is electrically connected to the electric heater, and fixed to the rotary table or a member configured to be rotated along with the rotary table, the power feeder is configured to supply the power to the fixed member of the second power transmission device, and the controller is configured to supply the power to the electric heater from the power feeder via the second power transmission device at least within a separation period during which the power receiving electrode is spaced apart from the power feeding electrode.

8. The substrate processing apparatus of claim 7, wherein the controller is configured to control a temperature of the rotary table within the separation period to be different from within a contact period during which the power receiving electrode is contacted with the power feeding electrode to thereby supply the power to the electric heater via the first power transmission device.

9. The substrate processing apparatus of claim 7, wherein the electric heater comprises a first heater element and a second heater element, a power supply to the first heater element is carried out through the first power transmission device, and a power supply to the second heater element is carried out through the second power transmission device.

10. The substrate processing apparatus of claim 9, wherein the power supply to the first heater element is carried out through the second power transmission device.

11. A substrate processing apparatus, comprising:

a rotary table configured to hold a substrate horizontally;

a rotation driving device configured to rotate the rotary table around a vertical axis;

an electric heater provided at the rotary table to be rotated along with the rotary table and configured to heat the substrate placed on the rotary table;

a power feeder configured to supply a power to the electric heater;

a power transmission device provided in a power transmission path between the electric heater and the power feeder, the power transmission device comprising a fixed member and a rotary member configured to be rotated relative to each other, the power transmission device being configured to supply the power from the fixed member to the rotary member even when the rotary member is being continuously rotated with respect to the fixed member, and the rotary member being electrically connected to the electric heater and fixed to the rotary table or a member configured to be rotated along with the rotary table;

a processing cup disposed to surround the rotary table, and connected to an exhaust pipeline and a drain pipeline;

at least one processing liquid nozzle configured to supply a processing liquid onto the substrate;

a processing liquid supply device configured to supply the processing liquid to the at least one processing liquid nozzle; and a controller configured to control the power feeder, the rotation driving device and the processing liquid supply device.

12. A substrate processing method of processing a substrate by using a substrate processing apparatus including: a rotary table configured to hold the substrate horizontally; a rotation driving device configured to rotate the rotary table around a vertical axis; an electric heater provided at the rotary table to be rotated along with the rotary table and configured to heat the substrate placed on the rotary table; a power receiving electrode provided at the rotary table to be rotated along with the rotary table and electrically connected to the electric heater; a power feeding electrode configured to be contacted with the power receiving electrode configured to supply a power to the electric heater via the power receiving electrode; an electrode moving device configured to connect and disconnect the power feeding electrode and the power receiving electrode relatively; a power feeder configured to supply the power to the power feeding electrode; a processing cup disposed to surround the rotary table and connected to an exhaust pipeline and a drain pipeline; a processing liquid nozzle configured to supply a processing liquid onto the substrate; a processing liquid supply device configured to supply the processing liquid to the processing liquid nozzle, the substrate processing method comprising:

holding the substrate on the rotary table horizontally;

forming, by supplying a chemical liquid as the processing liquid onto a top surface of the substrate, a puddle of the chemical liquid covering an entire top surface of the substrate;

processing the substrate with the chemical liquid by supplying the power to the electric heater from the power feeder in a state that the power receiving electrode and the power feeding electrode are contacted with each other and by heating the substrate and the chemical liquid on the substrate; and removing the chemical liquid from the rotary table and the substrate by distancing the power receiving electrode and the power feeding electrode apart from each other and rotating the rotary table continuously.

13. The substrate processing method of claim 12, wherein the processing of the substrate with the chemical liquid comprises agitating the chemical liquid on the substrate by rotating the rotary table forward and backward at a first rotational speed within a preset angular range in a state that the power receiving electrode and the power feeding electrode are in contact with each other to supply the power to the electric heater, and the first rotational speed is lower than a second rotational speed which is a rotational speed of the rotary table in the removing of the chemical liquid.

14. The substrate processing method of claim 12, further comprising:

after the removing of the chemical liquid, rinsing, by supplying a rinse liquid as the processing liquid onto the top surface of the substrate while rotating the rotary table in a state that the power receiving electrode and the power feeding electrode are spaced apart from each other, the chemical liquid on the substrate by the rinse liquid; and after the rinsing of the chemical liquid, removing the rinse liquid on the substrate by stopping the supply of the rinse liquid and rotating the rotary table.

15. The substrate processing method of claim 14, further comprising:

after the removing of the rinse liquid on the substrate by stopping the supply of the rinse liquid and rotating the rotary table, removing the rinse liquid remaining on the substrate by stopping the rotation of the rotary table and supplying the power to the electric heater from the power feeder in a state that the power receiving electrode and the power feeding electrode are contacted with each other to heat the substrate.

16. The substrate processing method of claim 15, further comprising:

separating the substrate from the rotary table by releasing the attracting after completing the removing of the rinse liquid on the substrate by stopping the supply of the rinse liquid and rotating the rotary table or the removing of the rinse liquid remaining on the substrate by stopping the rotation of the rotary table and supplying the power to the electric heater from the power feeder, wherein, in the separating of the substrate, the separating of the substrate is accelerated by flowing a purge gas in a suction line connected to an attraction plate provided at the rotary table.

17. The substrate processing method of claim 12, wherein the rotary table comprises an attraction plate, the holding of the substrate is performed by attracting the substrate to the attraction plate, and the heating of the substrate in the processing of the substrate with the chemical liquid is performed by heating the substrate, which is attracted to a top surface of the attraction plate, with the electric heater via the attraction plate from a bottom surface side of the attraction plate.

18. The substrate processing apparatus of claim 12, wherein the substrate processing apparatus comprises a first power transmission device and a second power transmission device configured to supply the power to the electric heater, the first power transmission device comprises the power receiving electrode and the power feeding electrode configured to be connected to or disconnected from each other by the electrode moving device, the second power transmission device comprises a fixed member and a rotary member configured to be rotated relative to each other, the second power transmission device is configured to supply the power from the fixed member to the rotary member even when the rotary member is being continuously rotated with respect to the fixed member, the rotary member is electrically connected to the electric heater, and fixed to the rotary table or a member configured to be rotated along with the rotary table, the power feeder is configured to supply the power to the fixed member of the second power transmission device, and wherein the substrate processing method further comprises heating the rotary table by supplying the power to the electric heater from the power feeder via the second power transmission device at least within a separation period during which the power receiving electrode is spaced apart from the power feeding electrode.

19. The substrate processing method of claim 18, wherein the electric heater comprises a first heater element and a second heater element, a power supply to the first heater element is carried out through the first power transmission device, a power supply to the second heater element is carried out through the second power transmission device, and the rotary table is heated by at least the first heater element in a contact period during which the power receiving electrode is contacted with the power feeding electrode to thereby supply the power to the electric heater via the first transmission device, and the rotary table is heated by using the second heater element in the separation period.

* * * * *